US007957949B1

(12) United States Patent
Subasic et al.

(10) Patent No.: US 7,957,949 B1
(45) Date of Patent: Jun. 7, 2011

(54) HIERARCHICAL SYSTEM DESIGN

(75) Inventors: Pero Subasic, Phoenix, AZ (US); Enis Aykut Dengi, Tempe, AZ (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 12/685,605

(22) Filed: Jan. 11, 2010

Related U.S. Application Data

(60) Division of application No. 11/202,742, filed on Aug. 12, 2005, now Pat. No. 7,657,416, which is a continuation of application No. 11/150,706, filed on Jun. 10, 2005, now abandoned.

(51) Int. Cl.
*G06F 17/50* (2006.01)
*G06G 7/62* (2006.01)
(52) U.S. Cl. ............................ 703/13; 716/132; 716/136
(58) Field of Classification Search ................. 703/13
See application file for complete search history.

(56) References Cited

U.S. PATENT DOCUMENTS

| | | | |
|---|---|---|---|
| 5,553,002 | A | 9/1996 | Dangelo et al. |
| 5,754,738 | A * | 5/1998 | Saucedo et al. ................ 706/11 |
| 6,327,552 | B2 * | 12/2001 | Nemani et al. ................. 703/2 |
| 6,442,743 | B1 | 8/2002 | Sarrafzadeh et al. |
| 6,625,785 | B2 * | 9/2003 | Chatterjee et al. ............. 716/4 |
| 6,687,887 | B1 | 2/2004 | Teig et al. |
| 6,694,501 | B2 | 2/2004 | Chang et al. |
| 6,832,182 | B1 * | 12/2004 | Wilson, Jr. ..................... 703/13 |
| 6,957,400 | B2 | 10/2005 | Liu et al. |
| 7,370,295 | B1 | 5/2008 | Chesal et al. |
| 7,437,343 | B1 | 10/2008 | Josephson et al. |
| 7,756,688 | B2 * | 7/2010 | Averill et al. .................. 703/2 |
| 2004/0111679 | A1 | 6/2004 | Subasic et al. |
| 2004/0153294 | A1 | 8/2004 | McConaghy |
| 2004/0243962 | A1 | 12/2004 | Subasic et al. |
| 2005/0200623 | A1 | 9/2005 | Smith et al. |
| 2005/0257178 | A1 | 11/2005 | Daems et al. |
| 2006/0015829 | A1 | 1/2006 | De Smedt et al. |

OTHER PUBLICATIONS

Lokanathan et al, "A Methodology for Concurrent Process-Circuit Optimization", IEEE Transactions on Computer-Aided Design of Integrated Circuits and Systems, vol. 18, No. 7, Jul. 1999.*
Lockanathan et al, "A Methodology for Concurrent Fabrication Process/Cell Library Optimization", Proceedings of the 33rd Annual Design Automation Conference, pp. 825-830, 1996.*
McAllister et al, "Integrating Linear Physical Programming Within Collaborative Optimization for Multiobjective Multidisciplinary Design", Struct Multidisc Optim (2005) 29: 178-189.*
Stelmack et al, "Application of the Concurrent Subspace Design Framework to Aircraft Brake Component Design Optimization", AIAA 98-2033, 1998.*
Andersen, E. et al., "A direct search algorithm for optimization with noisy function evaluations", SIAM J. Optim., vol. 11, No. 3, Feb. 2001, p. 837-857.
Fonseca, C., et al., "Multiobjective optimization and multiple constraint handling with evolutionary algorithms", IEEE Transactions on Systems, vol. 28, No. 1, (1998), p. 38-47.

(Continued)

*Primary Examiner* — Mary C Jacob
(74) *Attorney, Agent, or Firm* — Thomas Chan; Silicon Valley Patent Group LLP

(57) ABSTRACT

A method of system design, and more particularly a method of designing systems that achieve a set of performance goals using a hierarchically partitioned system representation wherein performance simulations are performed at multiple levels within the hierarchy and are combined to simulate a system level result in order to reduce the aggregate time required for performance simulation.

18 Claims, 24 Drawing Sheets

OTHER PUBLICATIONS

Kolda, T. et al., "Optimization by direct search: new perspectives on some classical and modern methods", SIAM Review, vol. 45, No. 3, (2003) p. 385-482.

Miranda, V et al., "EPSO—evolutionary particle swarm optimization, a new algorithm with applications in power systems", IEEE (2002), p. 745-750.

Smith, L. "A tutorial on principal components analysis", http://www.cs.otago.ac.nz/cosc453/student_tutorials, Feb. 26, 2002, p. 1-26.

Zitzler, E., "Multiobjective evolutionary algorithms: a comparative case study and the strength pareto approach", IEEE Trans. on Evo. Compu, vol. 3, No. 4, (1999), p. 257-271.

Nagasamy et al., "Specification, Planning and Synthesis in a VHDL Design Envinonment", IEEE Design and Test of Computers, vol. 9. Issue 2, pp. 56-88, Jun. 1992.

Alliot et al, "Architecture Exploration of a Large Scale System", Proceedings of the 5th IEEE International Workshop on Rapid System Prototyping, 2004.

Sobiezczanski-Sobieski et al, "Multidisciplinary Aerospace Design Optimization: Survey of Recent Developments", Structural and Multidisciplinary Opt., vol. 14, No. 1, Aug. 1997.

Eeckhout et al, "Workload Design: Selecting Representative Program Input Pairs", Proc. 2002 Int. Conf. on Parallel Arch. and Compilation Techniques, 2002.

Chien et al, "Designer Driven Topology Optimization for Pipelined Analog to Digital Converters", Proc. Design Automation and Test in Europe Conf. and Exh., Mar. 7-11, 2005.

Zhang et al, "Automatic Synthesis of a 2.1 GHz SiGe Low Noise Amplifier", 2002 IEEE Radio Frequency Integrated Circuits Symposium, pp. 125-128, 2002.

Rao et al, "Hierarchical Design Space Exploration for a Class of Digital Systems", IEEE Trans. on VLSI Systems, vol. 1, No. 3, pp. 282-295, Sep. 1993.

McFarland, "Using Bottom-up Design Techniques in the Synthesis of Digital Hardware from Abstract Behavioral Descriptions", IEEE 23rd Design Automation Conf., pp. 602-608, 1986.

De Smedt, et al, "Watson: Design Space Boundary Exploration and Model Generation for analog and RF IC", IEEE Trans. on C.A.D. of IC & Sys., vol. 22, No. 2, pp. 213-224, Sep. 2003.

* cited by examiner $DP_k \equiv [[x_n]_k [z_m]_k]$ $n = 1,\ldots N$ (the number of system variables)
$m = 1,\ldots M$ (the number of top level system performance goals)
$k = 1,\ldots K$ (the number of design points)

$k = 1, \ldots, K$ (the number of design points)
$j = 1, \ldots, J$ (the number of subsystems)
$n' = 1, \ldots, N'(j)$ (the number of variables per subsystem)
$m' = 1, \ldots, M'(j)$ (the number of performance goals per subsystem)

$$Dp_k \equiv [[x_{n'}]_{j,k}, [y_{m'}]_{j,k}]$$

n = 1,... N (the number of system variables)
m = 1,... M (the number of top level system performance goals)
k = 1,... K (the number of design points)
j = 1,... J (the number of subsystems)
n' = 1,... N'(j) (the number of variables per subsystem)
m' = 1,... M'(j) (the number of performance goals per subsystem)

124 — $DP_k \equiv [\,[x_n]_k, [z_m]_k\,]$
125 — $dP_k \equiv [\,[y_{m'}]_{j,k}, [z_m]_k\,]$
126 — $Dp_k \equiv [\,[x_{n'}]_{j,k}, [y_{m1}]_{j,k}\,]$

HIERARCHICAL SYSTEM DESIGN

CROSS-REFERENCE TO RELATED APPLICATIONS

This application for Patent is a divisional application of issued U.S. Pat. No. 7,657,416 (Ser. No. 11/202,742 filed on Aug. 12, 2005), which is a continuation of U.S. Ser. No. 11/150,706, filed on 10 Jun. 2005, and is now abandoned. The contents of the above priority applications are incorporated herein by reference.

STATEMENT OF RIGHTS TO INVENTIONS MADE UNDER FEDERALLY SPONSORED RESEARCH

This invention was made with United States Government support under grant number TIA F33615-01-2-1970 by the Defense Advanced Research Projects Agency (DARPA).

TECHNICAL FIELD

The present invention relates to a method of system design, and more particularly a method of designing systems that achieve, or try to achieve, a set of one or more performance goals using a hierarchically partitioned system representation for which performance simulations are conducted at multiple levels within the hierarchy, and can be subsequently combined to evaluate a system level result.

BACKGROUND ART

Systems are composed of components. Components can be represented by models of various sorts for purposes of simulation. The component models can be characterized by quantitative values, some of which are considered as being constant (i.e. they cannot be changed for design purposes), and others of which are considered as variable (i.e. "variables") for the purpose of adjusting system performance. The number of variables is the dimensionality of a variable space (i.e. "design space") within which sample sets of variable values resulting in desired system performance may be sought. Generally, a separate simulation is required for each sample. In order to more or less uniformly sample a region of design space, the number of samples, and therefore also the number of simulations, increases more or less superlinearly (e.g. exponentially) with the number of variables, or equivalently, the dimensionality of the design space. A prohibitively large simulation time requirement can easily result from the exploration of the design space for the purpose of determining practical system parameters for required performance because of the superlinear dependence of the number of samples to be simulated on the dimensionality of the design space.

One approach to manage this problem is to limit the number of variables in any given design space exploration, by fixing the values of some of the variables. This can reduce design space dimensionality, and correspondingly the execution time for necessary simulation, but it can also constrain the design space exploration so that samples of variable values corresponding to superior circuit performance may be missed. Additionally, the choice of which particular variables to be fixed for this approach may be difficult to determine a priori because it is not easily guided by a "designer's intuition" (i.e., expertise based upon a designer's prior experience with subcircuit building blocks). Another approach is to limit the size, but not the dimensionality, of the design space by constraining ranges of values for at least some variables. This can also result in a smaller design space to explore, and consequently reduce simulation time. Unfortunately, the best samples of variable values for system performance may lie outside of the explored region of design space.

It is therefore desirable to develop a method for system design that reduces design space dimensionality and therefore required simulation time, while also reducing the risk of missing sets of variable values corresponding to desired system performance, and while potentially and beneficially making use of a designer's intuition.

SUMMARY OF THE INVENTION

An embodiment of the present invention hierarchically partitions a system (or circuit) representation for design optimization into a top level system (or circuit) that operably interconnects a plurality of subsystems (or subcircuits), each having fewer variables for simulation than the original circuit. This results in multiple, independent design sub-spaces for exploration, but reduces the maximum dimensionality of each. This can decrease the aggregate execution time for required simulations because there are fewer samples per sub-space to simulate, and the execution time per simulation can be reduced, so that the total execution time for the separate simulation of all of the subcircuits is generally much less than the simulation time for an equivalent, flat circuit. Moreover, the execution of the multiple subcircuit simulations is more amenable to decomposition for execution on parallel processing computing systems than is the execution of a single, large circuit simulation.

In a further embodiment, a top level circuit and it's associated subcircuits are defined so as to make better use of a designer's intuition, thereby allowing for more intelligently guided exploration of the design space to speed the identification of variable value sets for desired system performance, while minimizing the risk of missing more nearly optimum design points. Another advantage of this embodiment is that intermediate circuit performance results are available for a designer to study at subcircuit levels of the hierarchical representation. This provides data for a circuit designer to analyze for developing further insights regarding the impact on circuit performance of the circuit design elements, their quantitative parameters, and their interrelationships. Moreover, because circuit designs are easily represented in hierarchical terms, such information is particularly meaningful. In a further embodiment of the present invention, principal components analysis ("PCA") is used to derive and examine such relationships, effectively modeling the simulated subcircuits. In other embodiments, data visualization techniques such as histograms and scatter plots aid a designer in analyzing the performance data.

This invention is a method and system for the exploration of hierarchical design space in the area of electronic design automation. It address issues of analysis and decision making in the presence of a large volume of design data from disparate sources, characterized in general with uncertain and/or incomplete information. The invention enables a circuit designer to efficiently accomplish the following tasks.

The circuit designer can gain an understanding of the structure of the circuit and data hierarchy (i.e. design points). This includes representation of the circuit hierarchy with associated design data for each node in the hierarchy, identification (designer-directed, or automatic) and representation of design families, back projection of design families to lower-level nodes in the hierarchy, analysis of input variable space and performance space patterns for each basic subcircuit and/or design family, and similar operations.

The circuit designer can conduct experiments based on the observed data and draw conclusions based on the outcomes of the experiments (or simulations). This includes designer-driven sampling and re-sampling of design points in the input variable space, propagation of results forwards and backwards through the hierarchy, and related operation.

The circuit designer can understand the consequences of making design decisions by evaluating different design options. This includes "what if" analyses showing changes in input patterns as design families are changed, automatic or designer-driven partitioning of the input space based on some features in the performance space of the subcircuit (such as feasibility-based partitioning, design family-based partitioning, operational condition-based partitioning), and so forth.

Specifically, by accomplishing these tasks, a circuit designer can address the following issues: (i) evaluation of the sensitivity and stability of a particular design across constituent design blocks; (ii) selection of a design to be physically implemented; (iii) cost estimation for switching between designs or design families (i.e. groups of similar designs); and (iv) finding the most cost-effective design set of suboptimal designs in the proximity of the tradeoff surface with minimal switching costs between them. These activities are facilitated by using a combination of techniques and algorithms from the fields of data visualization and data mining.

Although embodiments of the invention described herein are mainly illustrated with circuit design and design improvement examples, it is readily apparent to one of ordinary skill in the art that the invention may be applied to design analysis and design improvement problems for other types of systems for which a hierarchical system representation can be defined. Such hierarchically representable systems include, without limitation: (i) communication systems; (ii) information processing systems; (iii) optical systems; (iii) mechanical systems; (iv) chemical systems; (v) biological systems; (vi) management and social systems; and (vii) manufacturing operations and logistical systems.

BRIEF DESCRIPTION OF THE DRAWINGS

FIG. 24b is a legend for FIG. 24a.

DETAILED DESCRIPTION OF THE INVENTION

The present invention is directed toward a system and method for improved system simulation, analysis, and design. In accordance with one embodiment of the invention, a system is defined in a hierarchical manner having two or more levels of hierarchy. For example, the system can be defined as being comprised of one or more subsystems and those subsystems in turn, defined as being comprised of one or more of their constituent components, and so on. Once the hierarchical structure is defined, the system can be modeled in terms of its components, and these component models rolled up to the next level of the hierarchy for modeling that level, and so on. This technique can be implemented so as to enable the system to be modeled as a function of the models of its constituents. In this manner, changes can be made to various components and parameters at one or more levels of the hierarchy and the results rolled up to the higher levels for system optimization. In this discussion, the terms "modeled" and "simulated" will be used interchangeably to denote means for determining a system's, or a subsystem's (or a sub-subsystem's, or a component's, . . . etc.), performance metrics responsive to a set of input variable values.

Additionally, according to another embodiment of the invention, the overall system model can be rendered as a much simpler model. That is, it can be a model of its subsystem models (for example, each having limited inputs, outputs and variables) rather than a model comprising all the various components that make up the overall system. In this way, the number of permutations needed to be considered when performing simulations and analysis can be reduced dramatically. Also, according to another embodiment of the invention, the subsystems, sub-sub systems and so on can be drilled down in a focused manner to further ease the simulation and optimization burden. These embodiments can beneficially simplify and expedite what-if calculations and other simulation and optimization operations.

Figure 1:
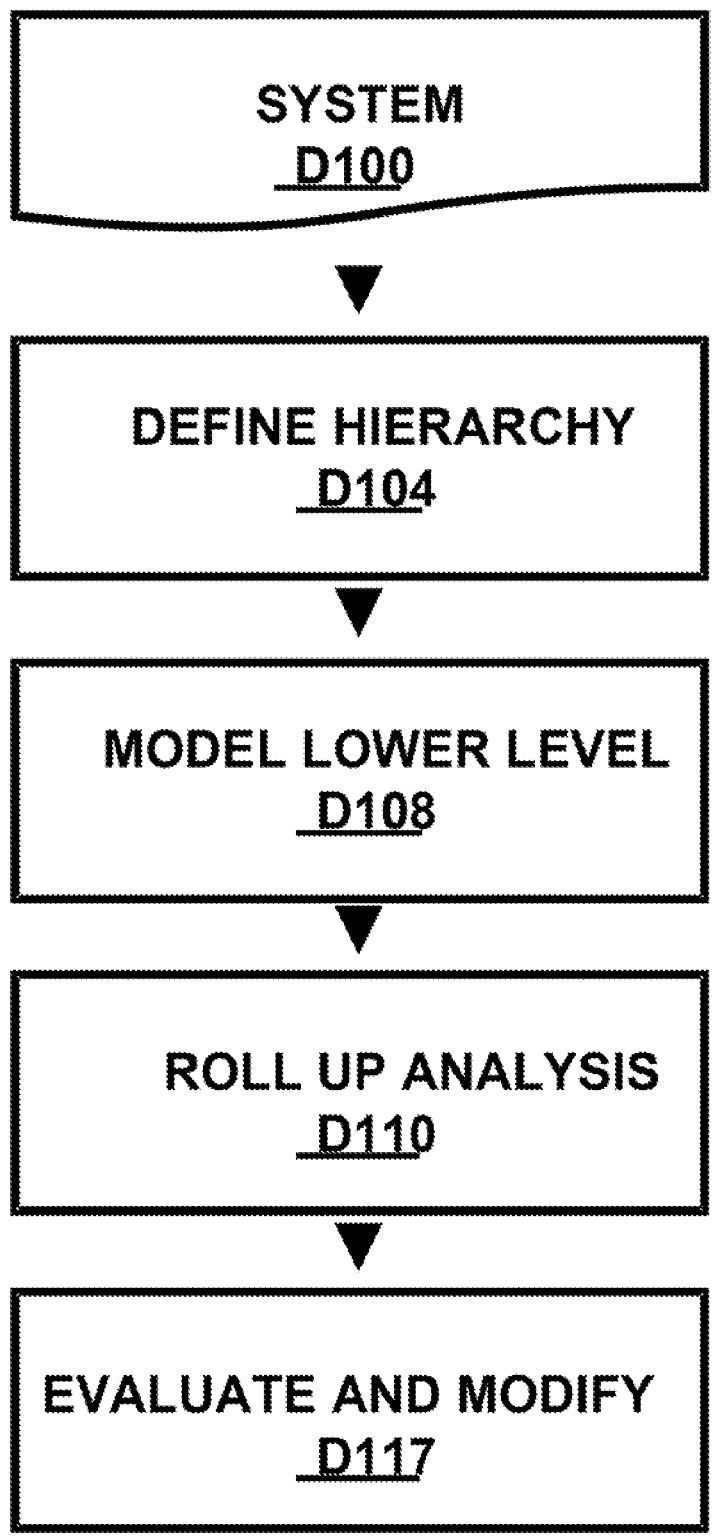
FIG. 1 is a flow chart illustrating a process for hierarchical simulation in accordance with one embodiment of the present invention.

FIG. 1 is an operational flow diagram illustrating a process for improved simulation and optimization in accordance with one embodiment of the invention. Referring now to FIG. 1, a system D100 is selected for modeling. The system may be any of a number of systems including, for example electrical and electronic systems, software, database and network systems, mechanical systems, automotive and avionics systems, medical device and treatment systems, just to name a few.

In a step D104, the system is broken down into two or more levels of hierarchy. That is, in one embodiment, a group of two or more subsystems are defined that together make up the overall system. These subsystems can be defined based on any of a variety of logical or physical boundaries and preferably have a discrete or well defined set of inputs and outputs as well as a discrete set of variables and performance metrics. They are also preferably defined in such a way so as to allow simulation of the performance metrics of the subsystems to be logically combined to model the overall system performance. Performance metrics for one or more of the subsystems can be defined in one embodiment as having a discrete and limited number of possible variable values for a given performance metric, thus preferably bounding the number of permutations possible for a given level of hierarchy. Additionally, in some embodiments, the variables may be fixed at a given subsystem level yet capable of adjustment at the next lower subsystem level in the hierarchy.

Thus, as described in the preceding paragraph, the hierarchy is defined so far as having two levels—this highest system level, and a next-highest subsystem level, or second level. Continuing with the hierarchical definition, this second level of subsystems can be further broken into its constituent components. This can be done much in the same way the first level was defined in terms of its constituent subsystem components at the second level. Thus, as a result of this, a third level of hierarchy is defined as having a plurality of components that roll up to the second level. This process can be continued until at some point in the process, the various sub systems and sub-sub systems etc. are broken down to their lowest component level. Some subsystems may reach this stage at a different level in the hierarchy from other systems.

For simplification and ease of illustration, in this example embodiment, the system is described as being defined in terms of three levels of hierarchy. For this example these are called the system level, the subsystem level and the component level. In this example, different groups of components are combined to create the various subsystems, and the subsystems are combined to create the system.

In a step D108, a lower level of the hierarchy is modeled. In terms of the current example, the subsystem level is modeled. In other words, each subsystem component is modeled in terms of the constituent components that make up that subsystem. In one embodiment, the components can have certain variables (for example, resistor values, capacitance values, inductance values, compact mathematical model parameter values, active device geometric parameters, . . . etc.), and these can be adjusted to affect the performance metrics for the subsystem of which they are a part. Thus, in one embodiment, a first guess at an ideal performance metric or set of metrics for each subsystem (level two) component is chosen and the constituent components (level three) are specified accordingly. As a result, according to one embodiment, the variable set size for the system at this level can be reduced to these subsystem performance metrics, which typically is a much smaller variable set than that of all the constituent components at level three.

In a step D110, the performance of the system (level one) is modeled as a function of the performance metrics selected for the subsystem (level two) components. The system level can be optimized at this point, if desired, by adjusting the performance metrics of the subsystem level. Thus, one or more performance metrics can be altered at the subsystem level, and the impact on the system simulated, and this process can be iterated until a desired result is achieved. With a given set of performance metrics defined and specified, the components can be specified for each subsystem to obtain the specified set of performance metrics. This step of evaluation and modification is illustrated by a step D117. Although this simple example illustrates three levels of hierarchy, it will become apparent to one of ordinary skill in the art after reading this description how to implement the invention and its various embodiments utilizing any number of levels of hierarchy.

Although the terms system, subsystem and component are generally used in the above example and at times elsewhere in this document to describe a highest, middle, and lowest level of hierarchy, respectively, it should be understood that this is done for illustrative purposes and not by way of limitation. That is, a system level in the hierarchy need not be the topmost level of a hierarchical representation. Likewise, the term component need not describe a discrete component or components in the lowest level in the hierarchy—indeed, a subsystem may have sub-subsystem components (to various levels) which may themselves have discrete components and so on.

Additionally, the term "top-level" as used herein generally describes a hierarchical level that has one or more lower levels of hierarchy below it. The term "top-level" is not meant to imply that the subject level must be the top-most level of a given hierarchy. In one embodiment, analysis to a "top level" refers to analysis of the system to the highest level in the hierarchy (in other words, overall top-most level system analysis). In an alternative embodiment, "top level" analysis refers to analysis of the system at a given level that is lower than the top-most level. Thus, the term "top level" as used throughout this document shall not be construed to require that the top level be the top-most level, although it can be.

Figure 2A:
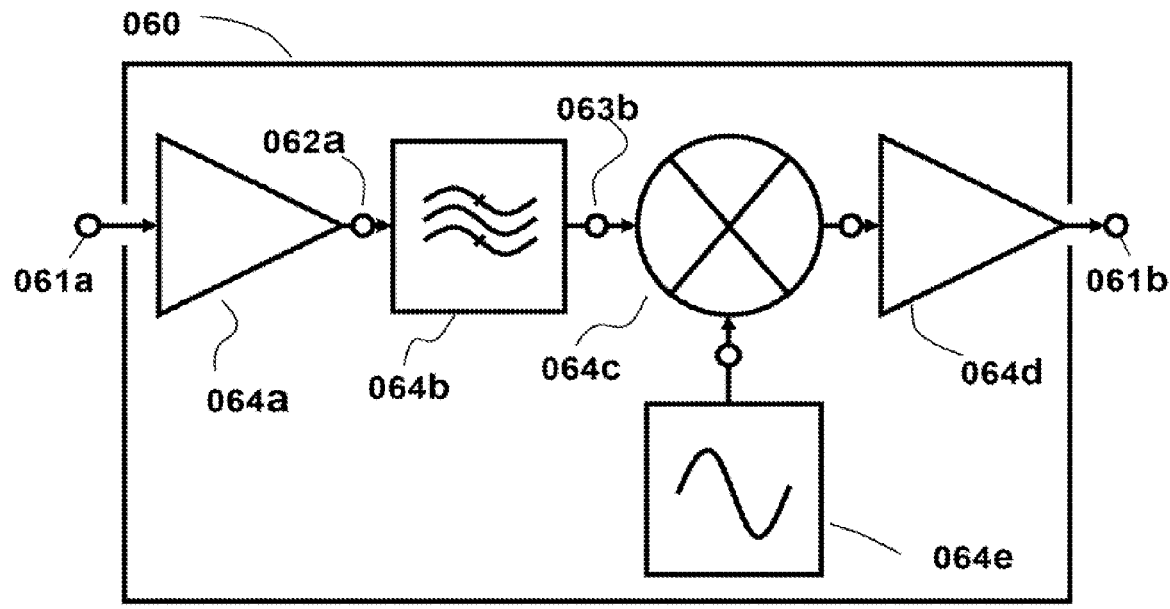
FIGS. 2a, 2b and 2c illustrate different levels of a design hierarchy for an example electrical circuit in accordance with one embodiment of the present invention.

Having thus provided a high level overview of various aspects and embodiments of the invention, an exemplary system with which the invention can be utilized is now described. Although the present invention can relate generally to the design of systems of many different types, for the purposes of illustration and ease of discussion, the invention is described herein in terms of a simple electrical circuit. After reading this description, it will become apparent to one of ordinary skill in the art how to implement the invention in applications involving other types of systems including those types of systems listed above. FIG. 2A is a diagram illustrating a simple electrical circuit 060 used as an example to illustrate one or more embodiments of the invention. Referring now to FIG. 2A, the example electric circuit 060 is a simple receiver circuit including an amplifier 064a, a band pass filter 064b, a mixer 064c, an oscillator 064e and an amplifier 064d. The receiver 060 represents a super heterodyne radio receiver with a radio frequency input 061a and an intermediate frequency output 061b. The amplifier output 062a is then provided to band pass filter 064b, which allows only amplified radio waves of a desired frequency band to pass through to mixer 064c. Mixer 064c is simultaneously driven by the amplified radio frequency signal 063b, and the output of local oscillator 064e. This results in a shill of the frequency band from the amplified radio frequency band to a new, intermediate frequency that is then amplified through amplifier 064d.

As described above, the exemplar system illustrated in FIG. 2A can be described as having multiple components or subsystems. These are, for example, amplifier 064a, a band pass filter 064b, a mixer 064c, an oscillator 064e and an amplifier 064d. These components can have a variables and performance parameters. For example, amplifier(s) 064a, 064d may have performance parameters such as gain, noise, linearity, and so on. As another example band pass filter 064b may have performance parameters such as bandwidth, amplitude response, group delay, distortion, and so on. Variables for the filter may be any of a number of variables including the number and values of poles and zeros, for example. Additional variables may be those defined by the performance parameters of the subsystems or components that comprise the bandpass filter at the next lowest level of the hierarchy.

Figure 2B:
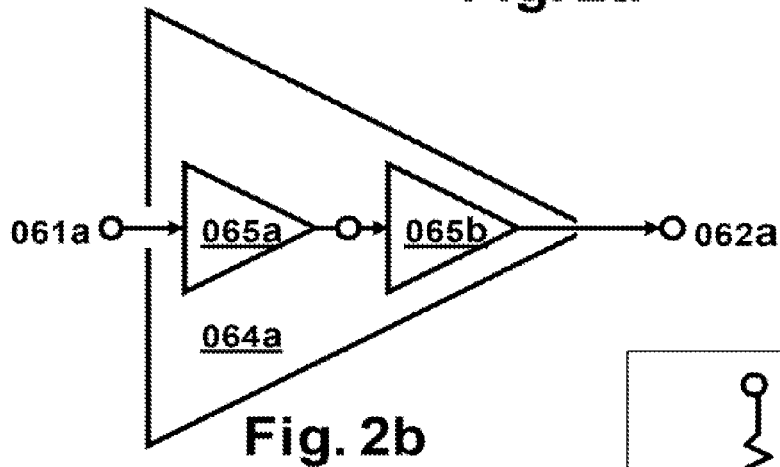

At the next level of hierarchy, each of these subsystems has its own set of subsystems or components. FIG. 2B is a simplified schematic diagram illustrating example subsystems of the amplifier 064a subsystem. Referring now to FIG. 2B, amplifier 064a is defined as having two cascaded gain stages 065a and 065b. Thus, for the system (for example, receiver 060) the second level of hierarchy for the amplifier 064a component can comprise the cascaded gain stages 065a and 065b. These level two subsystems can also have variables and performance metrics, and in one embodiment, the performance metrics of these gain stages 065a and 065b make up the variables of amplifier 064a at the next highest level.

Although the signal paths are represented as single lines in FIG. 2A, it is understood that an actual circuit schematic representation of the signal paths (and indeed the actual physical implementation) could involve multiple conductors or transmission lines for signal transmission. Also additional connections for power, control, ground, etc. are not illustrated in the exemplary FIG. 2A for the purposes of illustration. In terms of a hierarchical representation, for purposes of this example, FIG. 2A represents a system level of hierarchy.

Figure 2C:
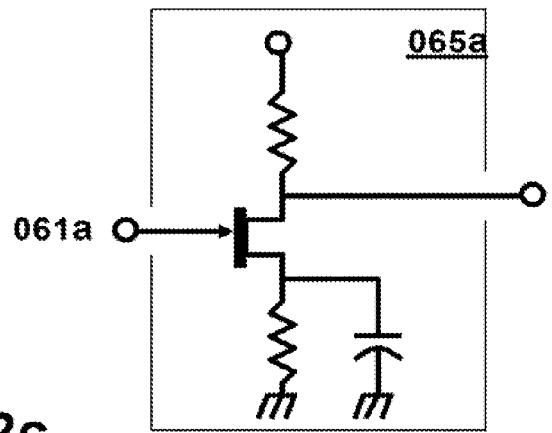

Continuing with this example to level three of the hierarchy, FIG. 2c illustrates an exemplary schematic of gain block 065a. The discrete components (resistors, transistor and capacitor) in this example represent the subsystems or components of gain block 065a as the level-three hierarchy. The performance parameters of these components can be viewed as variables that go into the performance metrics of gain block 065a.

As the example provided in FIG. 2 serves to illustrate, in one embodiment, the definition of a system in terms of a hierarchical structure can be made such that the subsystems and sub-subsystems represent functional wholes or units themselves. In this manner, simulation and modeling, and even optimization, of lower level components can be reused for different designs, at times with minimal or no changes required. Thus, for example, in one embodiment a library of subsystems can be maintained for use and reuse as building blocks in other systems.

Figure 3:
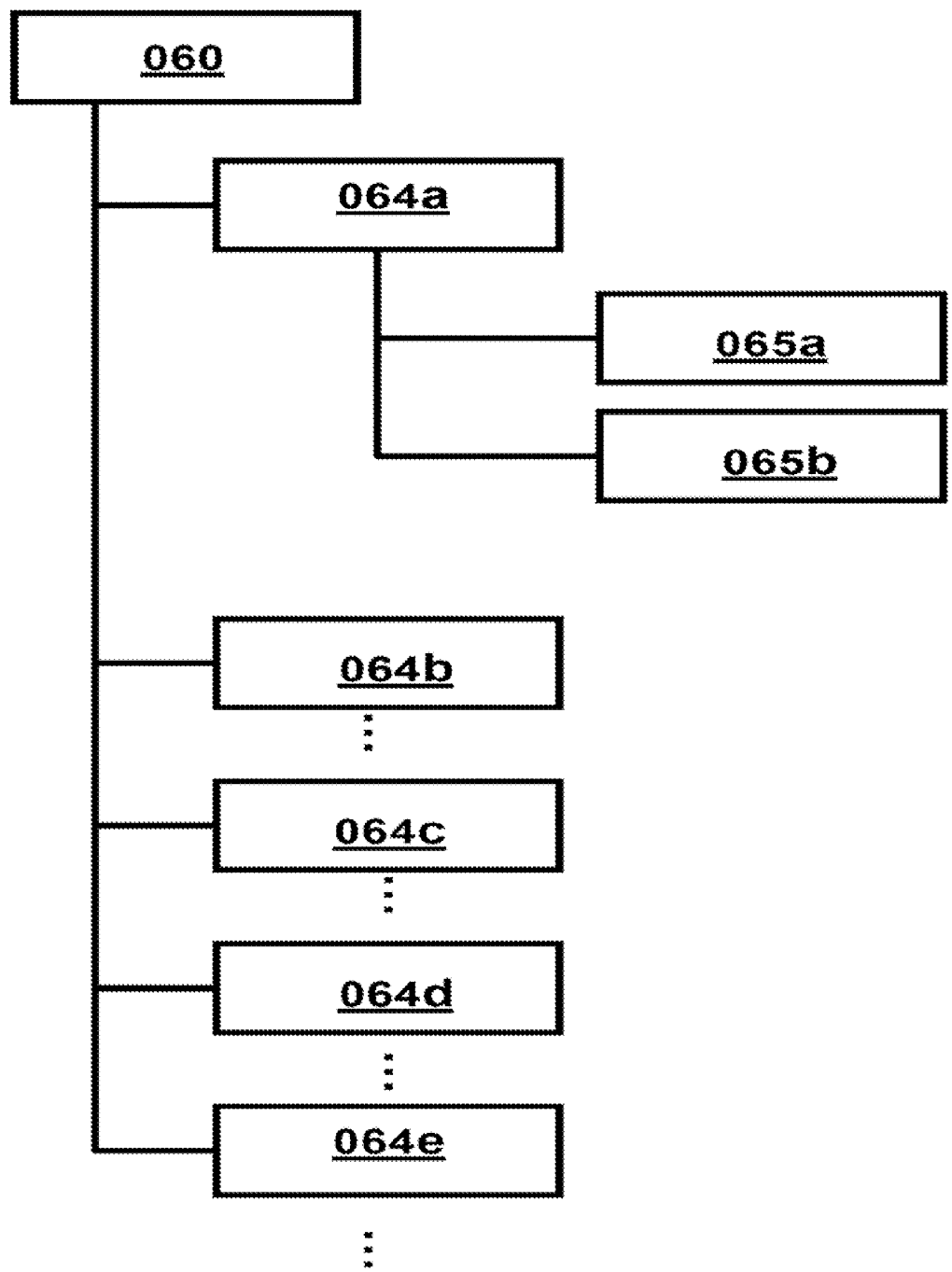
FIG. 3 is a diagram illustrating an example hierarchical tree description of the design hierarchy of FIG. 2.

FIG. 3 provides a representation of the hierarchical circuit of FIG. 2a in the form of a tree structure. This representation can be a useful representation for visually identifying levels of hierarchy and the subsystems and corresponding input/output nodes in one embodiment of the invention. Corresponding elements have the same designations in both FIG. 2 and FIG. 3.

According to conventional techniques, the performance of the circuit of FIG. 2a can be simulated based on a corresponding schematic containing the aggregate of all the components of all the functional blocks described above (i.e., such as that shown in FIG. 2c, but for the entire circuit). Such simulation is often used to predict the performance of a circuit before building it, and for exploring different options for component values and interconnections in an attempt to achieve the best circuit performance. However, because in such simulations the entire circuit is modeled and adjusted on one level, as the number of components increases, the number of permutations needed to evaluate and optimize the circuit rapidly approaches and often exceeds the practical capacity of modern computing equipment.

Figure 4:
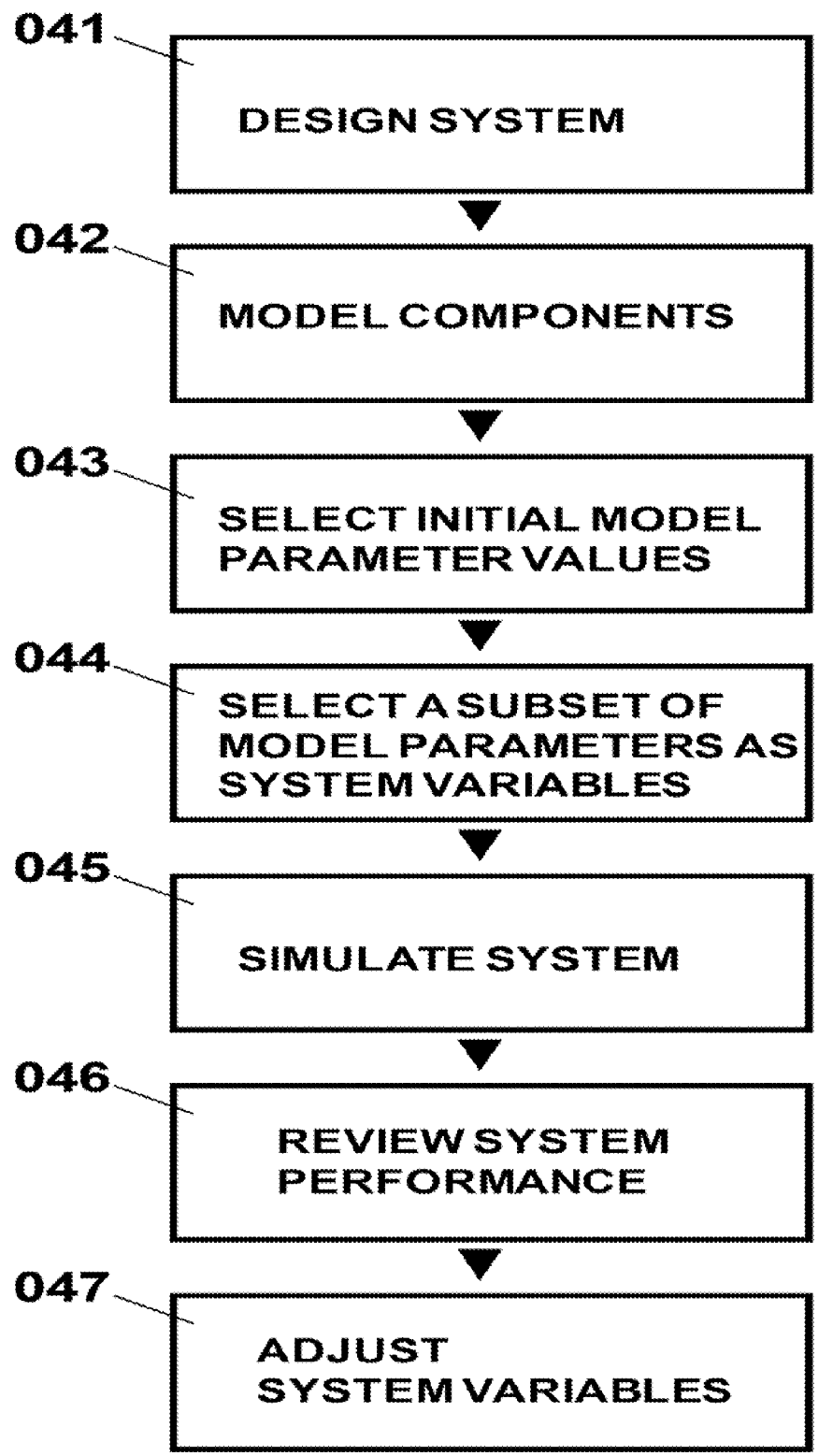
FIG. 4 is a flowchart showing a method for determining system variables corresponding to system performance using a flat, non-hierarchical system representation in accordance with one embodiment of the invention.

FIG. 4 is an operational flow diagram illustrating a process that can be employed to use a circuit simulator to design a circuit. (Note that "system" and "circuit" are used somewhat interchangeably, herein as a circuit is one example embodiment of a system. Likewise, for similar reasoning, the phrases "top level system" and "top level circuit," and "subsystem" and "subcircuit" may also be used interchangeably.) In a step 041, a circuit is designed by selecting appropriate components and connecting them together in an appropriate manner (preferably using software as opposed to physically). A circuit design is usually expressed as a circuit schematic drawing. Other types of systems may likewise have corresponding types of schematic drawings, e.g. plumbing diagrams for fluid transfer systems. For performance simulation by a computer, the schematic drawing is typically expressed in a form that a computer can work with. Typically, the interconnections between components are expressed as a connectivity matrix or "netlist." Thus, a netlist or other processor-friendly representation is generated. To facilitate modeling, in a step 042, the performance of the components, themselves, described in terms of electrical currents and voltages, or higher level performance metrics such as gain, noise figure, intermodulation, etc., responsive to input excitations are quantified in a form that the computer can use. That is, the components are modeled. Such models may be compactly expressed as mathematical relationships between inputs and outputs, or actual measurements may be made and stored in tabular form, for example. Often, compact models based on mathematical relationships are used. Such models have parameters whose values are adjusted to achieve proper performance emulation. Some parameters may be considered as fixed constants for a component model, whereas other parameters may be considered variable, and adjustable for design improvement purposes. Often these variable parameters ("variables") are constrained in range, or fixed in relationship to one another to reflect the physical realities of the components being modeled.

The subsystems (or components) can be modeled in one embodiment in a format that is interpretable by the information processing unit to reproduce a facsimile of behavior of those subsystems (or components) at their interfaces. Modeling may be accomplished by a variety of methods including, for example: (i) compact mathematical expressions; (ii) tabular listings of stored simulated or measured behavior; and (iii) statistically- or heuristically-based behavior modeling. U.S. Pat. No. 7,003,745 of common assignee with the present invention, discusses modeling techniques, and is incorporated herein by reference in its entirety. Regardless of the approach used for modeling subsystems (or components), the expressed behavior of the model can be related to the variable values. These design parameters may be fixed, meaning that they are not to be adjusted to alter overall system performance, or they may be variable in that they can be adjusted to alter overall system performance.

Still referring to FIG. 4, a set of initial values for the model parameters is selected in step 043. This can correspond to an initial designation of a system design. In a step 044, a subset of the model parameters can be selected as system variables that may be modified on a constrained or unconstrained basis to alter system performance metrics.

The next step 045 is performance simulation of the system. This can be done in a relatively straightforward manner as the inputs are provided to the virtual schematic in the simulation system, the performance parameters are applied and the outputs fed to subsequent inputs and so on until the model is complete. The results are reviewed 046 to determine if performance meets expectations or requirements. If not, which is often the case, the designer can review the output to determine what if any changes he or she might make to the layout or the components and rerun the simulation. The system variables can be adjusted 047 in an attempt to further improve system performance goal results in a subsequent iteration. Additionally, automated adjustments and simulation can be done within a defined number of permutations of circuit configurations. The techniques of adjusting the system variables could be as unstructured as trial and error, guided by a system designer's expertise, or by using advanced search algorithms.

As stated above, in step 045, the overall system can be simulated by an information processor or other processing device or system to generate performance goal results. Many techniques for simulating the performance of a circuit are well known in the electrical arts, and may be characterized by the types of circuits and the types of circuit responses that they can simulate. For example, a circuit consisting solely of linear resistors may be simulated through the manipulation of a representative matrix of real numbers. Simulation of a circuit that has been expanded to include linear reactive elements such as capacitors and inductors may use a modified matrix representation of complex numbers. A circuit made of linear and nonlinear resistive elements, may be simulated by solving a coupled set of nonlinear, algebraic equations. There are a number of well known numerical technical techniques to solve such a problem, including fixed-point iteration, Newton's method, secant method, and others. If reactive elements are added to such a nonlinear, resistive circuit, simulation can be performed by solving coupled, ordinary differential equations (also known as "state equations"), where time is an independent variable. Once again, the field is replete with numerous, well-known, and effective approaches for numerically solving these types of problems.

Of course, higher level measures of behavior such as power gain, noise figure, $3^{rd}$ order intercept (intermodulation distortion), and many others are well known in the field. Furthermore, there are well known rules for the cascading, and/or creating other operable combinations of components or sub-circuits characterized by such higher level measures that permit the calculation (simulation) of top level circuit performance in terms of the higher level measures. In FIG. 4, an entire circuit may be simulated in step 045 by one of the methods described above in terms of voltages and currents, and then higher level measures can be calculated from the simulated results.

Because there are typically a large number of components, the number of permutations or possible configurations to model and evaluate becomes quite large. Therefore, using conventional non-hierarchical techniques, the number of permutations rapidly exceeds the computational abilities of the processor(s) to complete the simulations in a practical period of time. This is especially true as Moore's law and other factors allow the number of components used for circuits or systems for integrated circuit implementation to increase steadily. Additionally, component adjustments or changes can have a ripple effect to other parameters.

However, redefining the system in a hierarchical manner can be done in such a way so as to allow the process to be controlled to a certain extent. For example, the highest system level can be defined with a manageable number of parameters and subsystems that make up those variables. In turn, each of its subsystems can similarly be modeled using a limited number of parameters, and so on. Thus, simulations can be run at the lowest level, those results rolled up to the next level, and so on until the system level is capable of being modeled as a function of its constituents. Simulations and what-if scenarios can be made with a smaller variable set and can also be done on a drill-down basis.

Figures 5A, 5B:
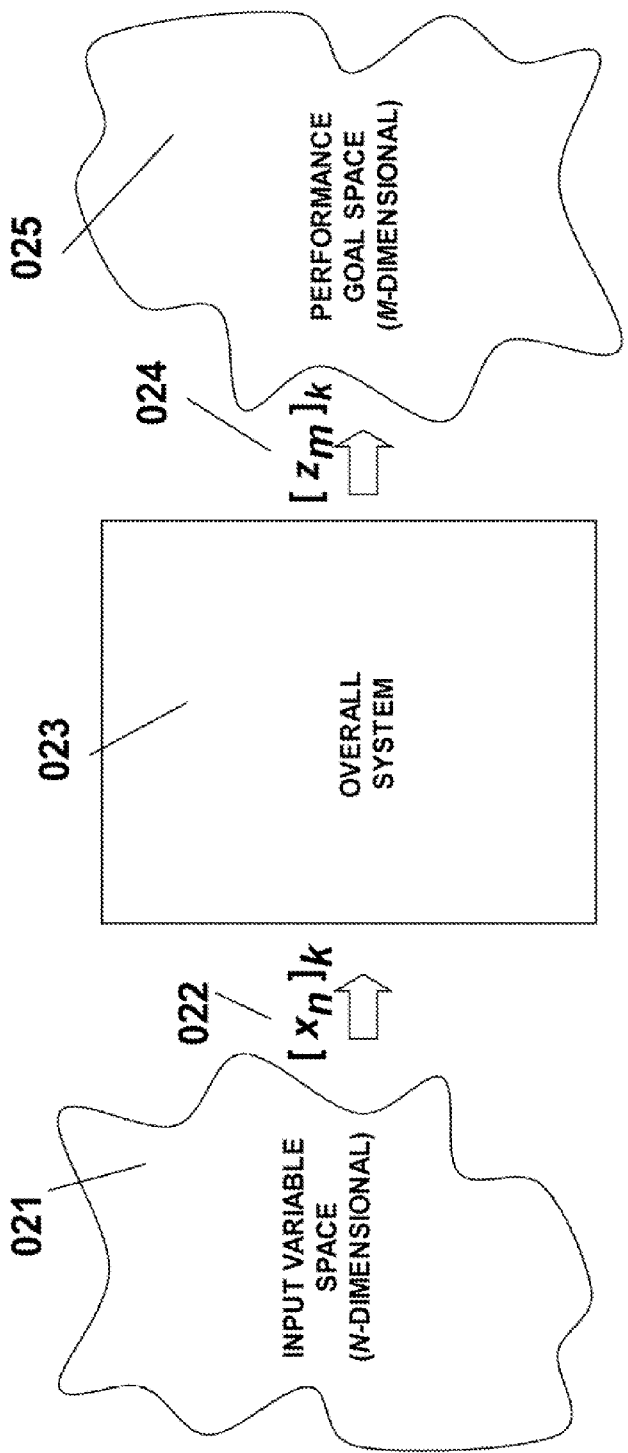
FIG. 5a depicts the transformation of input variables into performance goal results in accordance with one embodiment of the invention.
FIG. 5b describes a design point as an association of a set of input variables and a corresponding set of performance goal results using a flat, non-hierarchical system representation in accordance with one embodiment of the invention

FIG. 5a is a high-level block diagram illustrating an example of how the number of variables can be reduced in accordance with one embodiment of the invention. Referring now to FIG. 5a, a system 023, or a system simulator, or a system model can be viewed as transforming a tuple $[x_n]$ 022 from N-dimensional input variable space 021 into a tuple $[z_m]$ 024 in M-dimensional performance goal space 025. As used herein, a "tuple" refers to a collection of variable values in a given order. For a particular $k^{th}$ tuple, $[x_n]_k$, the associated tuple in output variable space is $[z_m]_k$. Together an input variable space tuple and its associated, performance goal space tuple is designated as a "design point," $DP_k$, as shown in FIG. 5b.

Figure 6:
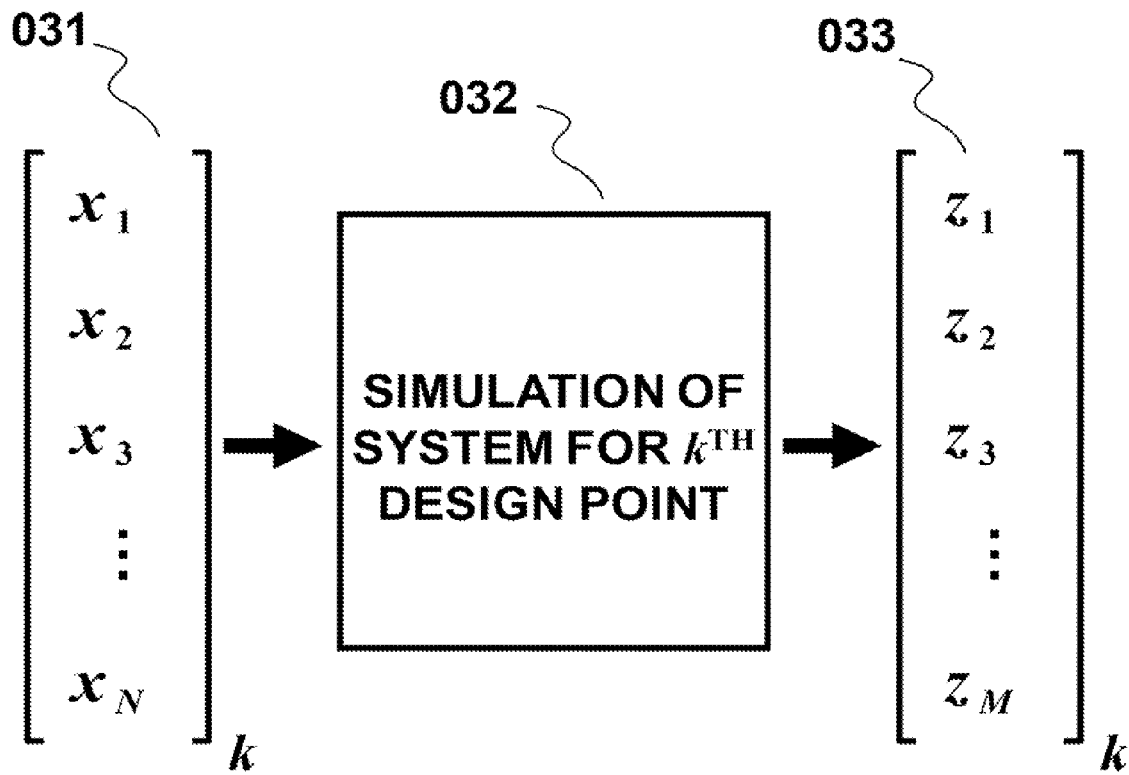
FIG. 6 illustrates a column vector representation of a system simulation transforming system variables into top level system performance goals in accordance with one embodiment of the invention.

FIG. 6 illustrates the same example transformation as FIG. 5a, but showing a column vector representation of a $k^{th}$ input variable value tuple $[x_n]_k$ 031 being transformed by a $k^{th}$ system simulation 032, into a $k^{th}$ performance goal tuple $[z_m]_k$ 033. A "design point" can be thought of as a way to bundle experimental conditions for a simulation with corresponding simulation results in order to keep track of information about the design simulations.

Figure 7:
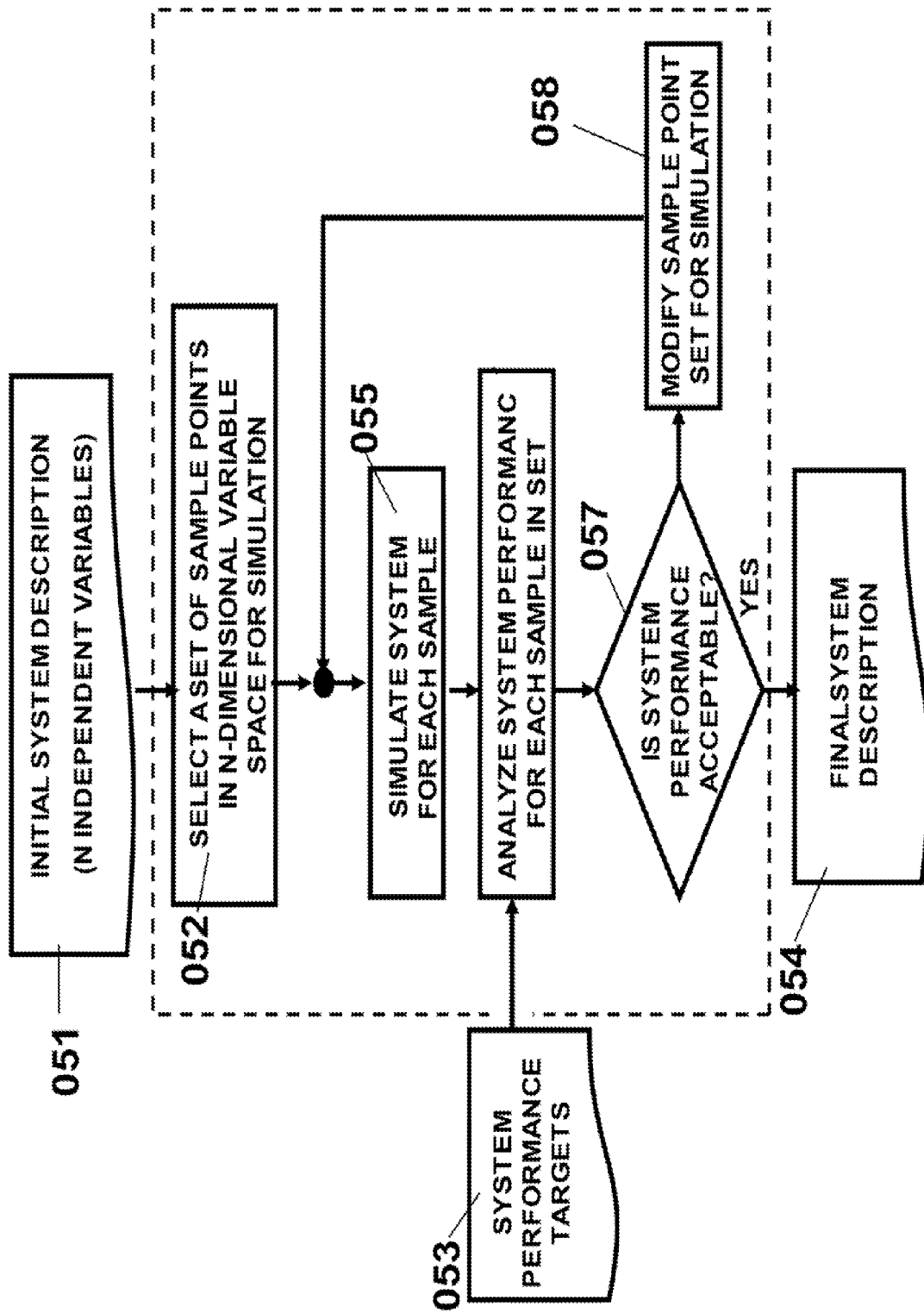
FIG. 7 illustrates an example method for determining system variables corresponding to system performance in accordance with one embodiment of the invention.

The simulation based design process shown in FIG. 4 may be carried out automatically by a data processor. FIG. 7 is an operational flow diagram illustrating an example process for carrying out the simulation in accordance with one embodiment of the invention. The example process illustrated in FIG. 7 starts with an initial system description 051 and the designation of N independent variables. N can be chosen to correspond to the dimensionality of the variable space. In general, the larger that N is, the larger that a set of sample points 052 to be simulated will be. Because simulation 055 can be a time consuming process, even with modern processing power, a smaller N is preferably sought.

Figure 8:
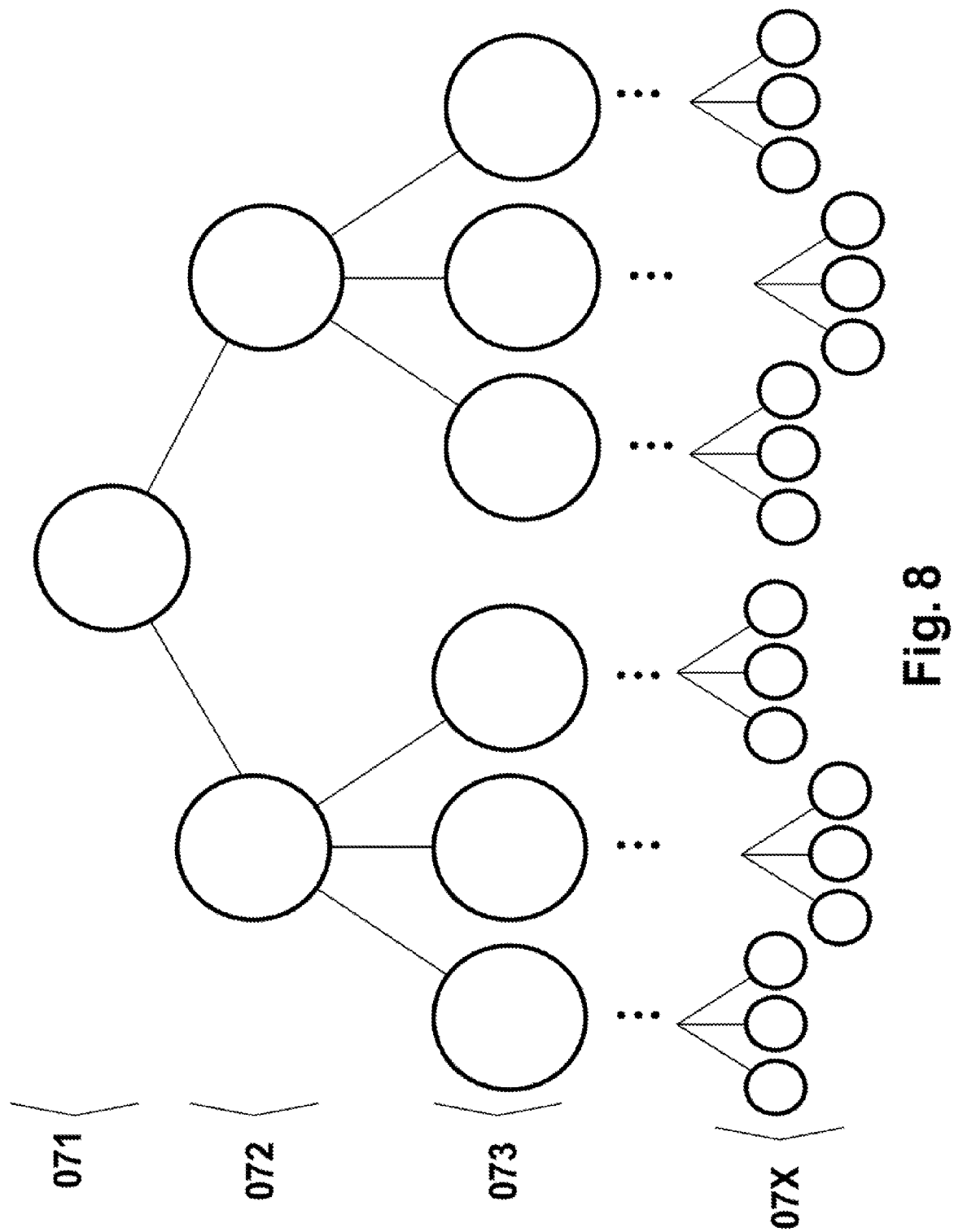
FIG. 8 illustrates an example of a multi-level, hierarchical representation of a system.

As described above, redefining the system in a hierarchical manner is a technique that can be utilized to reduce the number of variables used to run simulations 055 of the system. FIG. 8 is a diagram generally illustrating how a system 071 may be represented in a hierarchical fashion in accordance with one embodiment of the invention. As illustrated in FIG. 8, the system 071 can be represented by multiple levels of hierarchy wherein a subsystem in one level (e.g. 072) can be represented by one or more subsystems in the next lower level (e.g. 073) until ultimately a leaf node is reached. In the illustrated example, this is level 07X. Note, however, that the leaf nodes for each family need not necessarily terminate at the same level of hierarchy across all elements.

Utilizing a hierarchical representation and rolling up simulations from lower nodes to higher nodes can be implemented so as to reduce the dimensionality of the design optimization problem. To reiterate the previous example, the top level circuit 060 of FIG. 2a, and its collective constituent subsystems 064 may be assigned to correspond to the top level 071 and the first level 072 of FIG. 8, respectively. After reading this description, it will become apparent to one of ordinary skill in the art that each subsystem of FIG. 8 could additionally be represented as combinations of lower level subsystems.

Referring again to FIG. 7, for each set of sample points 052, a comparison 057 of simulated performance goals versus system performance targets 053 can be made. For example, in terms of the exemplary embodiment illustrated in FIG. 2A, the performance targets 053 can include system gain, noise and TOI. In this step, these targeted metrics can be compared to the metrics 'measured' by the simulation to determine whether the designer's goals have been met or exceeded.

If the system performance targets 053 have been achieved, generally within a pre-specified tolerance, a final system description 054 can be output. This system description 054, can include the system definition and values for all model parameters and variables. These can be specified all the way down to the discrete component level, as it is this combination and configuration of components that led to meeting the performance targets 053.

Of course, in many cases, the first attempt at system design will not yield an optimally performing system. Therefore, in the event that system performance targets 053 have not been achieved, the system variables can be modified 058 in an attempt to achieve improved performance. Many different approaches may be used to modify 058 the system variables, as are well known in the art of optimization. Computer-based optimization approaches include: random search, pattern search, cluster search, gradient search, simulated annealing, and others. In one embodiment described below, cluster-based algorithms described below, can be used to allow the system to facilitate design space optimization. These and similar techniques can be used to facilitate a drill-down into portions of the system that will more likely yield desired performance metrics, and perhaps a suitable tradeoff among them. Once any variable changes have been made 058, the system can be simulated 055 again using the modified system variables.

Figure 9:
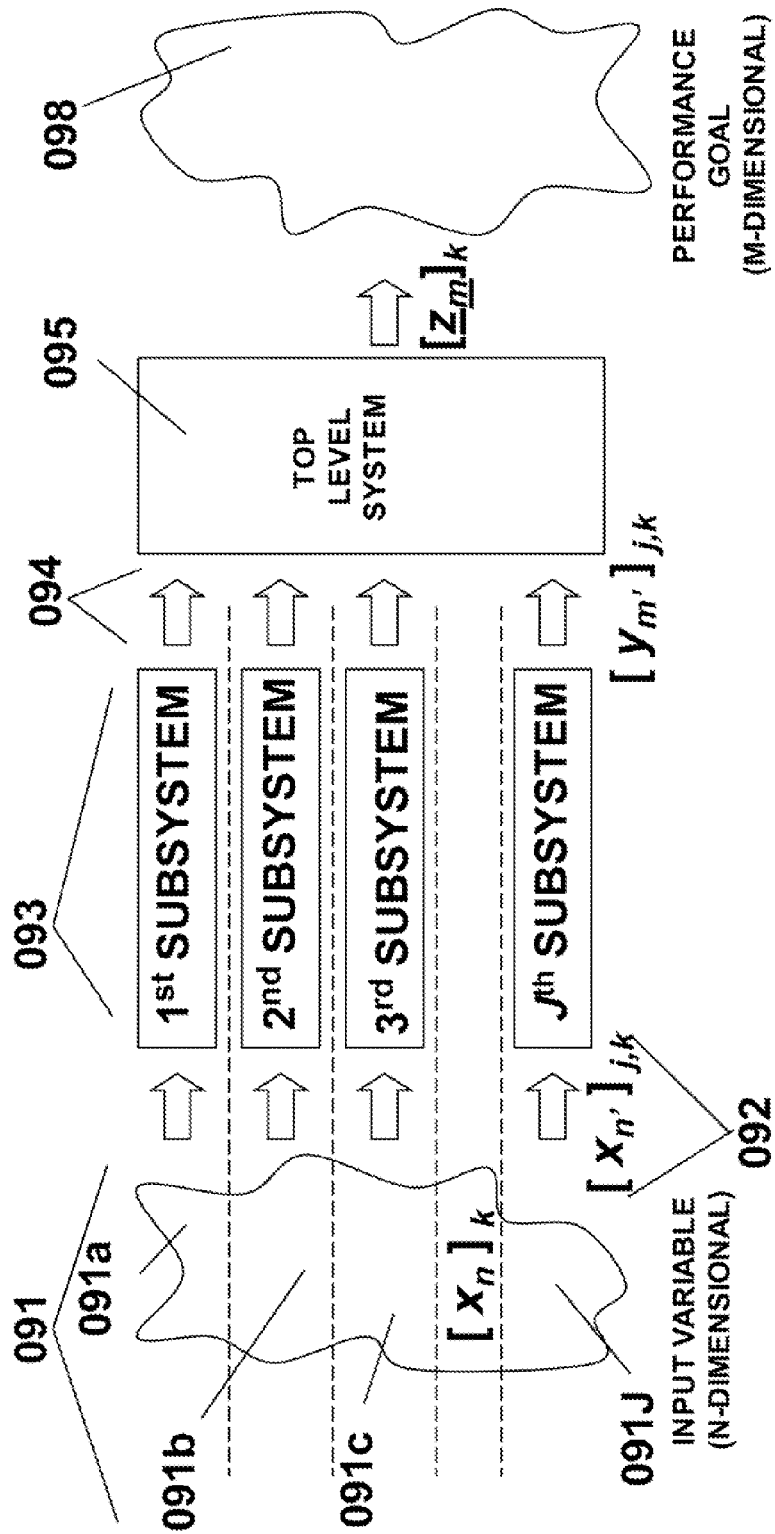
FIG. 9 illustrates partitioning N-dimensional variable space into a plurality of lower-dimensional variable spaces, each for separate subsystem simulation in accordance with one embodiment of the invention.

FIG. 9 represents a circuit simulation method based upon multiple subcircuit simulations followed by a top level circuit simulation, in an embodiment of the invention. N-dimensional variable space 091 is divided into J subspaces (091a through 091J) each having dimensionality or less than N. Tuples $[x_n]_{j,k}$ 092 representing sets of variable values within each subspace are used for simulation by their respective subcircuit simulators 093, resulting in respective performance results 094. Respective performance results 094 are then used as inputs to top level system simulator 095 to generate top level system performance goals (results) 098.

Figures 10, 11:
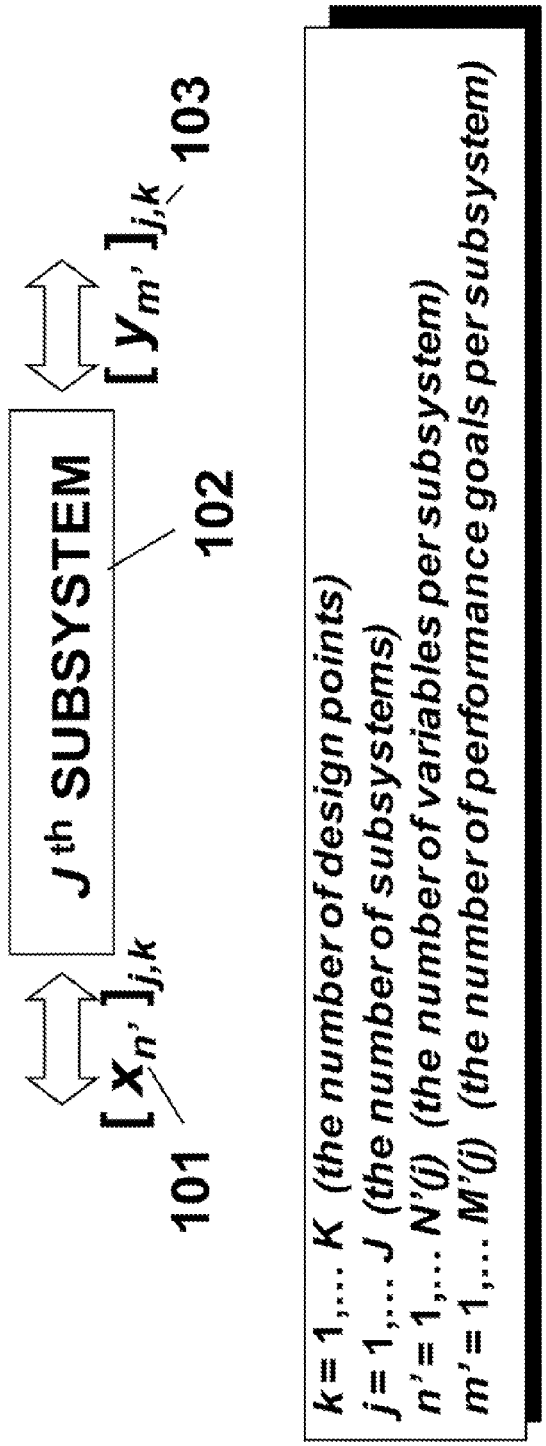
FIG. 10 illustrates a subsystem simulation transforming a set of independent variables for a subsystem, into a performance result for that subsystem in accordance with one embodiment of the invention.
FIG. 11 illustrates a "subsystem design point" comprising a set of subsystem independent variables and an associated set of performance results in accordance with one embodiment of the invention.
Figure 12:
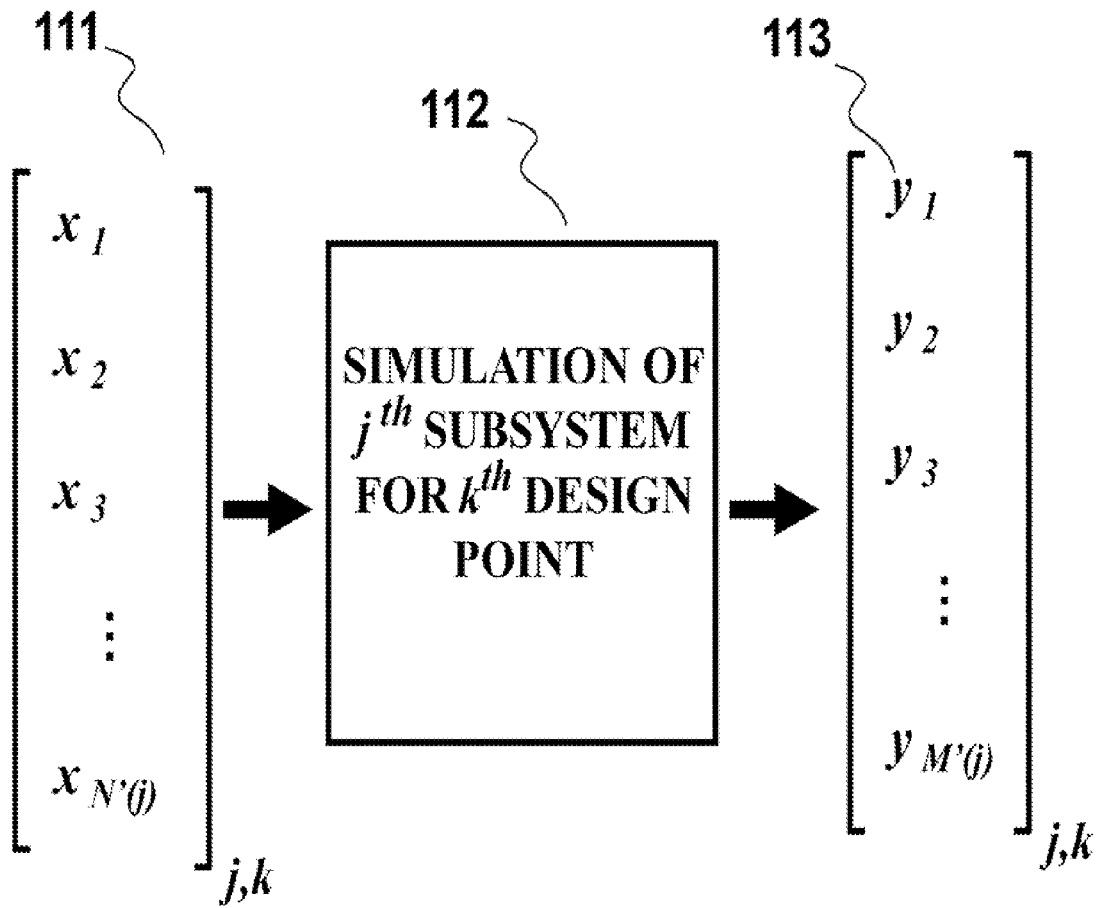
FIG. 12 illustrates an example of using simulation to transform subsystem input variables for a subsystem into subsystem system performance results in accordance with one embodiment of the invention.

FIG. 10 shows a detail of a $j^{th}$ subsystem simulator 102 transforming a $k^{th}$ tuple of subcircuit input variables 101 into a $k^{th}$ tuple of subcircuit responses (goals) 103. FIG. 11 shows an aggregation of a $k^{th}$ subcircuit input variable tuple and a $k^{th}$ subcircuit response tuple into a $k^{th}$ subcircuit design point $Dp_k$ 104. FIG. 12 presents an alternate depiction of the generation of subcircuit response tuples 113, based upon subcircuit input variable tuples 111 by simulator 112, in an embodiment of the invention. Note that these design points can be commutative (i.e. the association between a set of input variable values and a corresponding set of simulated circuit responses applies in both directions).

Figures 13A, 13B:
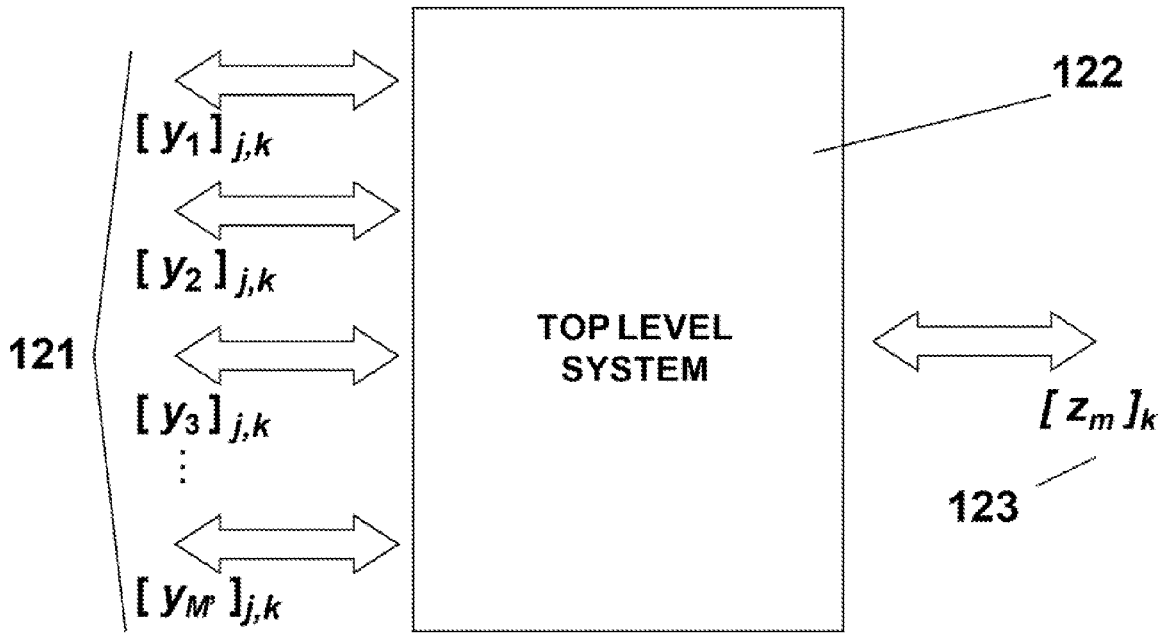
FIG. 13a illustrates a top level system simulation transforming multiple subsystem performance results into a set of top level system performance results in accordance with one embodiment of the invention.
FIG. 13b illustrates "design points" defined in terms of various combinations of input, intermediate, and output variables in accordance with one embodiment of the invention.

FIG. 13a illustrates a top level system simulation 122 transforming multiple subsystem performance results 121 into a set of top level system performance results 123 in accordance with one embodiment of the invention. Both top level circuit response and subcircuit response types of tuples may be defined in embodiments of the invention as appropriate for circuit characterization and/or as convenient and meaningful for a circuit designer. For example the simulated performance result tuples could be phasor voltages and/or currents, or higher level characterizations such as power gain, signal/noise ratios, harmonic distortion, and/or extrapolated intermodulation intercept points. Custom performance characterizations may also be defined for special purposes, including, for example, time domain waveform attributes such as rise and fall times. For high level subcircuit response characterizations, the top level system simulator can operate on the high level subcircuit responses to generate a top level circuit response using rules and methods that are well known to the electrical arts, for example, cascading: gains, noise figures, and intermodulation intercept points.

Figure 14:
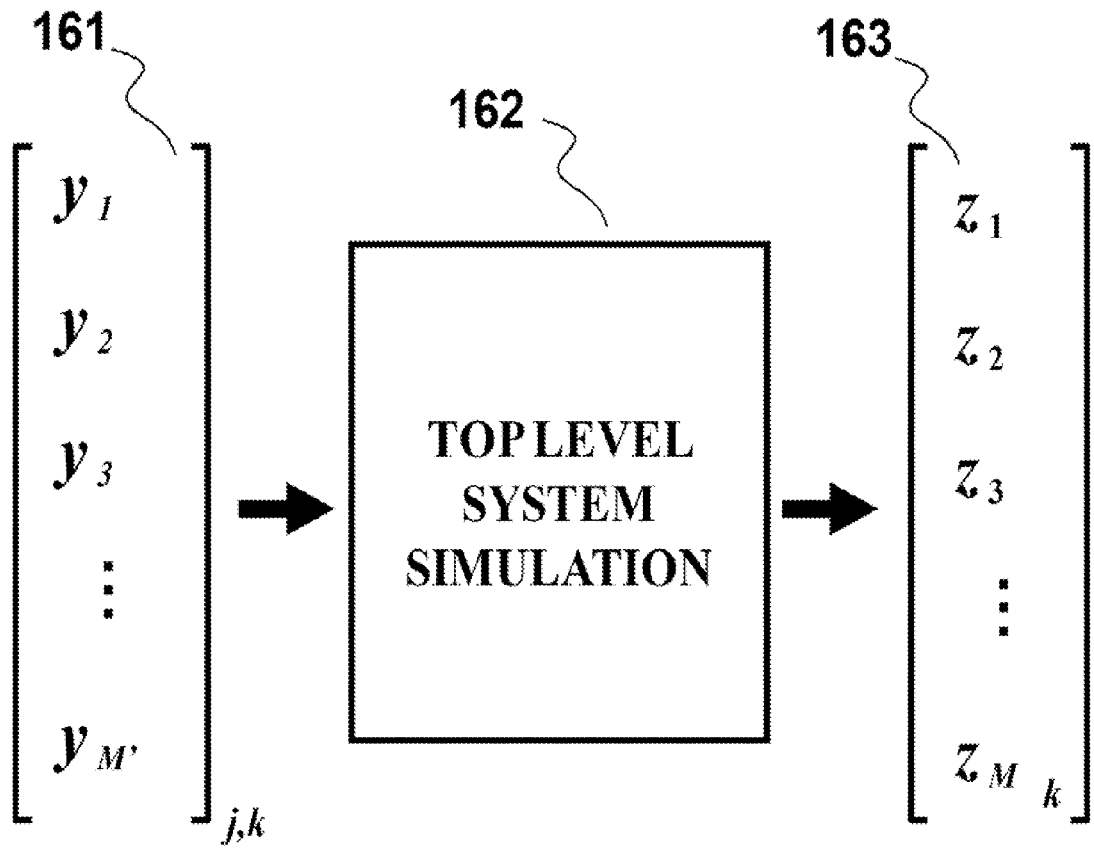
FIG. 14 illustrates an example application using an embodiment of the invention to explore hierarchical design space.

FIG. 13b summarizes the ways in which design points can be defined in an embodiment of the invention. $DP_k$ 124 defines a $k^{th}$ design point in terms of overall variables and top level circuit response. $dP_k$ 125 defines a $k^{th}$ design point in terms of subcircuit responses and top level circuit response. And, $Dp_k$ 126 defines a $k^{th}$ design point in terms of subcircuit variables and subcircuit responses. FIG. 14 is an alternate depiction of an embodiment of the invention wherein a top level circuit simulator 162 calculates top level circuit performance goals 163 on the basis of subcircuit performance results 161. Note that these design points can be associative (i.e. a set of $Dp_k$'s and $dPk$'s of J points each define a $DP_k$).

An example embodiment of the current invention is now described in terms of this convention, wherein an overall design point $DP_k$ can be determined by performing subsystem simulations, and rolling them up the hierarchy to an overall system simulation, and associating $Dp_k$ and a $dP_k$. A top level system (for example, the receiver circuit in accordance with the example illustrated in FIG. 2) is designed from functionally described subcircuits (for example, FIGS. 2B and 2C). In this step, subsystems (for example, circuits and subcircuits, including specified components and interconnections down to the lowest level) are designed, or selected from previous designs, according to their functional requirements. This design preferably extends to the lowest level of the hierarchy where components and interconnections or interrelationships are specified.

The subsystems or components are modeled at a lower level, preferably beginning at the lowest level and design points (for example, sets of designs) for a given subsystem or component can be specified. In one embodiment, for example, a subsystem or component may be modeled with different combinations of input variables set to arrive at a plurality of different design points for that subsystem or component, depending on the variable definitions used. Each design point preferably has a set of one or more performance parameters associated therewith. In this step, fixed parameters can be set, and variables chosen to arrive at various design points.

An advantage of this embodiment is that subsystems can be separately simulated or modeled and design points thereby generated. This can be used to reduce the dimensionality per simulation, thereby reducing the aggregate simulation time for all of the subcircuits, as described above.

A subsequent next-level simulation can then performed based on the previous level simulation results. This embodiment can reduce the dimensionality of a single, flat simulation, to the maximum of the dimensionalities of the multiple subcircuit simulations, with a corresponding superlinear decrease in simulator execution time. Some additional execution time may be required for the top level simulation, but generally there is a significant overall decrease in execution time. For example, in testing using the NeoCircuit application from Cadence Design Systems, Inc., the simulation time required to optimize, by reviewing performance results, adjusting variables, and re-simulating, for a radio frequency section for a typical cell phone was reduced from days to minutes, with the same number of independent variables considered.

Figure 15:
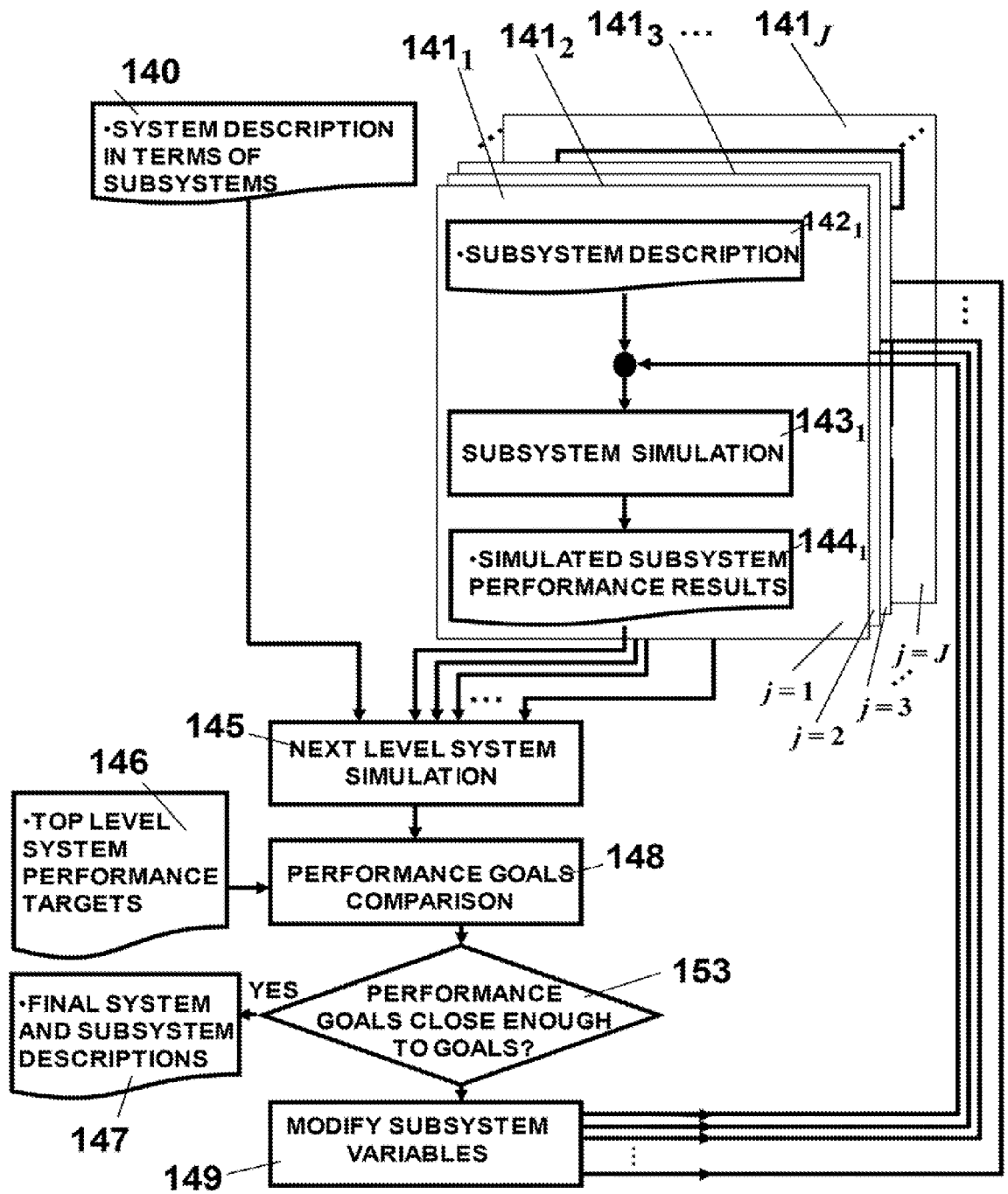
FIG. 15 illustrates a flowchart of an embodiment of the invention in which higher-level performance metrics goals are automatically achieved based on hierarchical system design simulation.

The simulation based design may be carried out manually, or in an automated process. FIG. 15 is an operational flow diagram illustrating a process for automated simulation in accordance with one embodiment of the invention. Referring now to FIG. 15, the system is specified in terms of a plurality of subsystems. Although only one level of subsystems is illustrated, it will be obvious to one of ordinary skill in the art after reading this description how the invention can be implemented using additional levels of hierarchy and rolling lower levels up to the higher levels.

In a step 140, the system is described in terms of its constituent subsystems 141. Illustrated in FIG. 15 are J subsystems $141_1$-$141_J$ at a given level of hierarchy. The subsystems 141 preferably each include a subsystem corresponding description 142 that can be used to generate a simulation result for that subsystem 142. The subsystem can include various input variables or other parameters that can be specified for that subsystem. For example, these may be component values for a circuit. They may also be performance parameters or performance goals for a subsystem of subsystem 142 (i.e., a sub-subsystem). Combinations of these input variables can be made to produce the one or more various design points used for the subsystem 142. Each design point for a subsystem can in turn have one or more performance goals for that subsystem 142. These performance parameters can be the variables for subsystem 142 as a part of it's next level subsystem (for example, subsystem 142 is a sub-subsystem of the next higher level). Ideally, however, the number of performance goals for a subsystem and its various design points is less than the number of variables used to create those design points. Advantages gained from this scaling are often augmented when the number of possible permutations of each variable set is considered.

Therefore, in a step 143, the subsystem 142 is simulated. This can be accomplished, for example, using the one or more simulation techniques described herein. This simulation step results in the one or more performance goals or performance parameters as discussed above. This is illustrated by results 144.

In many cases, it can be assumed that the designer knows the type of lower-level subsystems he or she wishes to specify. For example, in the example implementation of FIG. 2, the designer may know what circuit blocks he or she wants to use for synthesis. For example, the designer may want to use a two-stage amplifier, a one-stage amplifier, a mixer and similar circuits. In some cases, there may also be a certain amount of simulation data available for each circuit block to be synthesized. In the simple case of a two-level hierarchy, for example, simulation results may be available for each block representing a subcircuit.

In a step 145 the system is simulated at the next highest level using the performance results 144 from the pervious level and the hierarchical specification 140 of the system. This process can be repeated iteratively working up the hierarchy to the overall system level.

Simulation data is a set of design points. For the lowest-level blocks (which, in the circuit example, represent basic circuits), a design point can include two vectors: a vector of parameters of basic circuit elements and a vector of performance parameters for that block. For example, for an amplifier a design point can include a set of elements such as transistor sizes, resistor and capacitance values of corresponding elements; and typical performance parameters of an amplifier such as gain, noise factor, distortion, and the like. Again, in many cases there may already be a certain number of these data points available for each subcircuit at the lowest level of the hierarchy as an input to the algorithm.

The system performance targets 146 can be compared with actual results in a step 148 to determine whether design targets are met satisfactorily. This can be done level by level, for interim results, or for the top level. In step 153, if the performance goals 148 for the circuit compare favorably with top level circuit performance targets 146 (for example, if the top level circuit performance targets 146 have been achieved, generally within a pre-specified tolerance), a final circuit description 147 can be generated. This can include the circuit and subcircuit definition and values for all model parameters and variables.

On the other hand, if top level circuit performance targets 146 have not been achieved satisfactorily, one or more subcircuit variables are modified as illustrated in step 149 in an attempt to achieve better performance. Many different approaches may be used to modify the subcircuit variables, including those well known in the art of computer optimization as discussed above.

Each modified subcircuit is simulated 143 using the modified subcircuit variables, and the circuit performance is again simulated 145 using the subcircuit simulation results 144. Advantageously, only branches of the hierarchy in which variables have changed need to be re-simulated in one embodiment of the invention. Thus, in this embodiment, not every subcircuit needs to be simulated on subsequent iterations depending on the extent of the variable changes.

This process is iteratively repeated until the simulated top level circuit performance goals are close enough to the top level circuit performance targets, or until another stopping criterion, is reached. An exemplary stopping criterion may be as simple as a limit on the maximum number of simulation iterations, or alternately may relate to other considerations connected to the computer optimization method used.

Decomposing a large dimensional circuit simulation into multiple subcircuit simulations based on functionally designated subcircuits as can be implemented with the present invention offers many advantages for the design optimization process, in addition to reducing the dimensionality of the design variable space to be explored as will now be explained. In one embodiment, a cluster based algorithm is utilized to aid in the analysis of simulation results and focus attempts at subsystem modification, preferably based on performance goals.

In one embodiment, this algorithm applies to the hierarchical synthesis of circuits in the area of electronic design automation, although it has applicability to other systems as well. As described above in the heterodyne receiver example, hierarchical synthesis arises where a new circuit is designed by combining smaller subcircuits. Generally in this setting, the composition of smaller subcircuits can be made in conjunction with design of a particular subcircuit out of many subcircuits available. At the bottommost level, at the leaf nodes of the hierarchy, basic circuit elements such as transistors, resistors, capacitive elements, inductors, and so on can be found. As discussed, one goal is to synthesize a top-level circuit out of a number of lower-level circuits such that the performance parameters at the top level (perhaps corresponding to the circuit as a whole) satisfy performance goals set by a designer. During this process, a designer typically enters the goals and design preferences into the algorithm and runs the automated hierarchical synthesis algorithm.

According to one embodiment, the cluster-based algorithm can be implemented so as to produce a number of designs that satisfy all goals (so called feasible designs), and can be ordered by preference criteria. Such preference criteria can be, for example, set by the designer or system specifier. By using additional preferences and the specifier's own, often subjective judgment, the designer then selects a design to be implemented. In one embodiment, this preferred design can include all relevant parameters of the design so that the design can be realized, for example, on a silicon chip. That means that all parameters of basic circuit elements at the lowest level of the hierarchy (sizes of transistors, resistors and other basic elements) can be generated from a designer's choice.

Design points from a subsystem can be obtained by simulation or from previously obtained data sets. The source of the design points for lowest-level circuits can include, for example, results of the sizing run on that circuit itself and results of applying sampling algorithm for that circuit only and then measuring performance parameters for each sampled point at the input. Of course, this does not exclude other possible approaches to generating design points.

In one embodiment, the number of points generated this way is not set in advance, and is not important. It is useful that a certain number of design points do exist. Although not necessary, a minimal number of points can be set in order to facilitate better algorithm response in the early stages of hierarchical synthesis.

Implementation of a cluster-based approach is now described in the context of the system being a circuit such as, for example, the circuit illustrated in FIG. 2. For purposes of this discussion a design point set for each subcircuit is denoted with $CDP_i$, i=1, . . . , c. A priority list of design point combinations from subcircuits can be ordered by decreasing value of their cost function, feasibility degree or some combination thereof. This is denoted with a priority list for this example.

A Clustering tree is created and denoted with $ST_i$ for each subcircuit i=1, . . . , c. The clustering tree can include one or more clusters generated to a point during a run of the algorithm. The nodes in the tree can be used to represent generated clusters. Each node has an associated depth or level in the tree.

Figure 16:
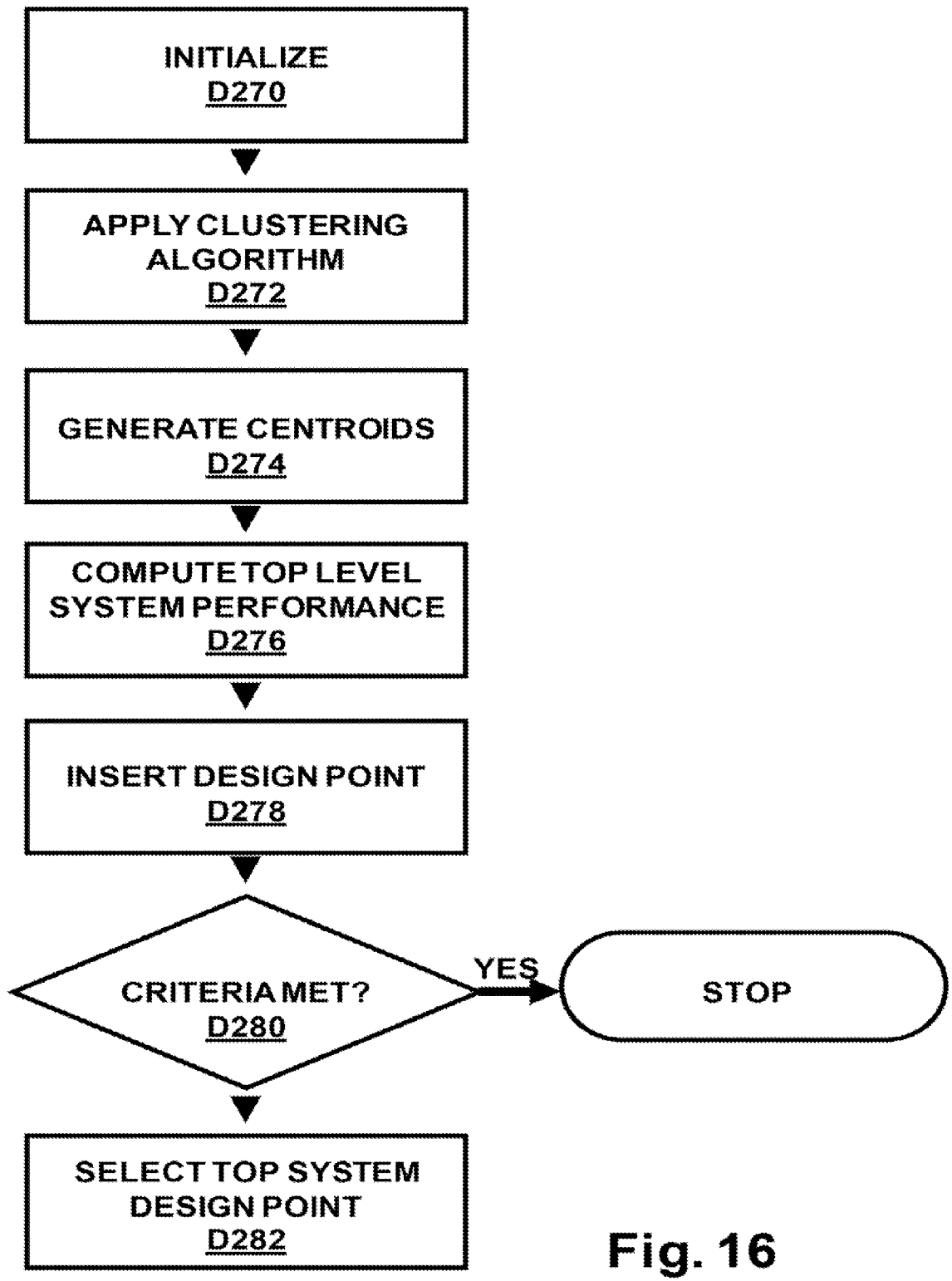
FIG. 16 is a flowchart illustrating an example for using a clustering algorithm in accordance with one embodiment of the invention.

FIG. 16 is an operational flow diagram illustrating an exemplary process of the cluster based algorithm in accordance with one embodiment of the invention. Referring now to FIG. 16, in a step 270, values are initialized. In one embodiment the system can first set $CDP_1=DP_1$, $CDP_2=DP_2$, . . . , $CDP_c=DP_c$.

In a step 272, a clustering algorithm is applied on design points from the set $CDP_i$ based on the distances between performance parameters of design points. This can be done for each set of design points $CDP_i$. As a result, the clustering algorithm generates clusters of points $C_{i,j}$, j=1, . . . , $cl_i$ for each subcircuit i=1, . . . , c for which it is run. The clusters can be defined as having a real centroid point, which, in one embodiment is a point from $CDP_i$ closest to the cluster centroid. The real centroid point can be denoted from subcircuit i and cluster j with $RCP_{i,j}$. Note that the number of clusters for each subcircuit $cl_i$ can be different. Note also that the number of clusters for each subcircuit is typically much lower than the number of design points in the set $CDP_i$. A set of clusters generated from the set $CDP_i$ is denoted with $C_i$ and consists of clusters $C_{i,j}$, j=1, . . . , $cl_i$.

According to one embodiment of the invention, step 272 can be implemented with any of a number of clustering algorithms including, for example, k-means, fuzzy k-means, partitioning, average link, clink, or any other clustering or classification algorithm. Additionally, a standardization step can be applied before clustering step on the clustering data. Furthermore, a standardization step and a principal components analysis/factor analysis step can be applied before the clustering step on the clustering data.

In a step 274, a set of c-tuples of real centroid points $RCP_{i,j}$, i=1, . . . , c, j=1, . . . $cl_i$ are generated for i, j, where the tuple can have the form ($RCP_{1,j1}$, $RCP_{2,j2}$, . . . , $RCP_{c,jc}$) where (j1, j2, jc) are permutations of c elements each of which is taken from the set $j_i=1$, . . . , $cl_i$. This can generate the mathematical product of $cl_1*cl_2* \ldots *cl_c$ combinations of real centroid points from different subcircuits. The set of so generated point combinations can be denoted with RCPS.

In a step 276, for each design point combination in RCPS, compute higher-level system performance parameters by combining RCPS performance parameters from the previous levels in the hierarchy, and repeating the process until the top-level performance parameters are computed. The cost function and the degree of feasibility for each so computed top-level design point can also be computed.

In a step 278, system design point can be inserted into the priority list, thereby maintaining the order of the priority list such that system design points are listed with ascending associated costs.

In a step 280, if the termination criteria are satisfactorily met, the operation can complete. On the other hand, if the criteria are not satisfied, the operation continues at a step 282. In step 282, the top system design point is selected from the priority list. In one embodiment, this can be accomplished by traversing the subcircuit hierarchy and identifying all tuples of subcircuit clusters $C_{i,j}$: ($C_{1,j1}$, $C_{2,j2}$, . . . , $C_{c,jc}$) that correspond to that point. The currently active design point can be set to point to design points from the respective subcircuit clusters $CDP_i=C_{i,j}$. In other words, $CDP_1=C_{1,j1}$, $CDP_2=C_{2,j2}$, ..., $CDP_c=C_{c,jc}$.

Additionally, a re-sampling step can be inserted such that for each $CDP_i$, i=1, ..., c a set of points is generated from the low-level subcircuit input parameter space such that the number of points in $CDP_i$ is increased to ensure higher-level precision of the performance evaluation and search process.

In another embodiment, the best design point can be selected such that an upper limit is placed on the cluster level for clusters used to generate that point. This can be implemented so as to limit the algorithm to explore the clusters at the depth lower than the specified depth. This ensures better coverage of the design space and therefore larger variance of generated combinations/system design points.

In one embodiment, top-level system performance can be computed by using designer-provided expressions relating performance parameters from level 1 to performance parameters to level 1-1 all the way to the top level 0 (or the higher system level). In some embodiments, the performance at the level 1 can be computed by using any of behavioral simulation approaches such as, but not limited to, black-box, white-box, grey-box simulation using the parameters from the level 1-1 all the way to the top level 0 (or the higher system level).

In additional embodiments, cost and feasibility degree can be computed for some or all of the design point combinations in step 276 of the original algorithm by using designer-provided expressions relating performance parameters from level 1 to performance parameters to level 1-1 all the way to the top level 0, and a subset of b ("best") so computed design point combinations can be used to compute cost by using the embodiment described above, wherein the performance at the level 1 is computed by using any of behavioral simulation approaches such as, but not limited to, black-box, white-box, grey-box simulation using the parameters from the level 1-1 all the way to the top level 0 (or the system level). Monotonically decreasing cost functions can be achieved by using any of behavioral simulation approaches such as, but not limited to, black-box, white-box, grey-box simulation using the parameters from the level 1-1 all the way to the top level 0 (or the higher system level).

The algorithm can be allowed to continue iterations until any of a desired number of termination criteria are met. For example, the algorithm can be implemented so as to stop when a certain number of system-level design points is generated; stop after certain period of time has elapsed; stop after certain number of system-level points with feasibility threshold greater than the given limit threshold is found; or stop after a certain number of system-level points with cost lower than given threshold is found.

As described, the algorithm can combine a real centroid belonging to the clusters at the same level in the respective clustering trees. One embodiment of the algorithm contains an additional step where clusters from different levels of clustering trees are combined and the respective costs are computed for those combinations. These combinations can be generated after a certain number of iterations of the algorithm. In one embodiment of this algorithm variant, the clusters used to generate these multi-level combinations are selected by getting the best points (i.e. the clusters corresponding to them) from the priority list so far. In another implementation of this embodiment, the clusters for combinations are selected such that the clusters with the greatest number of accesses are selected. Those are the clusters that correspond to the best cluster combinations (i.e. real centroid points with lowest cost) selected so far during the search process.

In further embodiments, the algorithm can be implemented so as to provide the capability to dynamically adjust one or more of the algorithm parameters. Typically, a designer will make adjustments after monitoring algorithm activity and reacting to its reported output such as (but not limited to) current performance indicators of the algorithm, current 'best' design point, current maximal level of exploration (limit threshold), multi-level mixing of clusters behavior, termination criteria and the like.

Additionally, all relevant data pertaining to the current state of the algorithm can be saved in a database, including generated clusters with the corresponding design points, levels in the clustering tree, real centroid points; list of current 'best' points, list of all generated combinations, and other data relevant to the functioning of the algorithm. This data remains persistent in computer mass storage (e.g. computer disc) and is available for analysis, algorithm continuation with different parameters and other purposes.

Dynamic, cluster-based partitioning enables exploration of search space that is tailored to the available data. Therefore, the search space is explored systematically and more efficiently.

As stated above, a priority list of design point combinations from subcircuits can be ordered by decreasing value of their cost function. The cost function can be computed based on the system level performance goals or other factors such as preferences defined by the user. The preference can be defined as a request to minimize or maximize certain performance goals, although other methods can be used.

Figure 17:
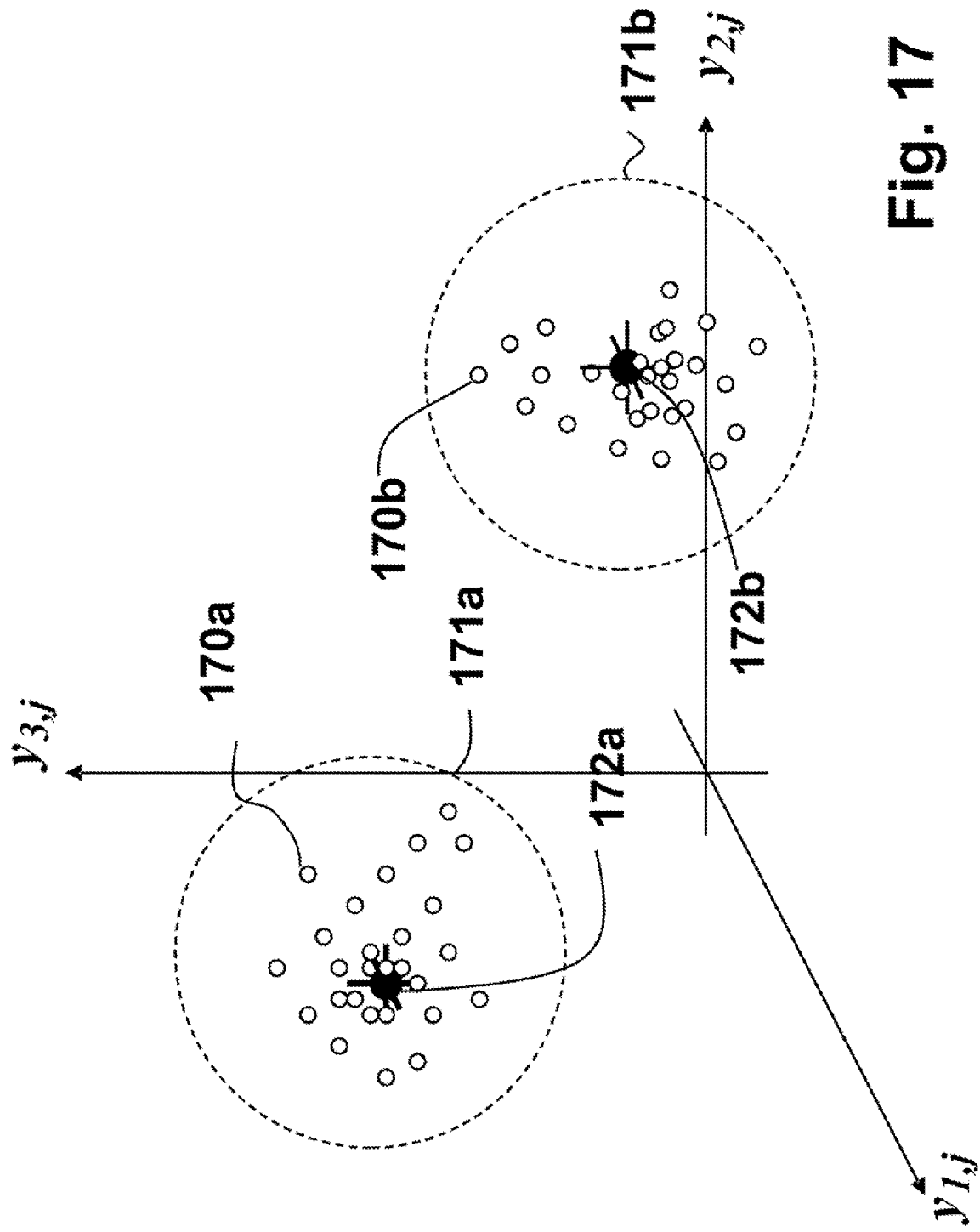
FIG. 17 is an exemplary plot of clusters of a subsystem's performance results against values for various design points in accordance with one embodiment of the invention.

FIG. 17 shows three subcircuit performance results y for a $j^{th}$ subcircuit simulation plotted against one another for a number of subcircuit design points in an embodiment of the invention. In this particular example the design points (e.g. 170a, 170b) tend to form two clusters, 171a and 171b, around centroids 172a and 172b, respectively, for the design points within the clusters. Although as illustrated, the design point clusters are identified in a three dimensional space corresponding to a particular selection of three subcircuit performance goals, any combination of any practical number of subcircuit performance goals may, in general, be analyzed for design point cluster formation by numerically calculating distances between design points in the corresponding space. Centroids (e.g. 172a and 172b) may likewise be calculated numerically.

In one embodiment, the "distance" between design points is calculated as a cost distance or cost differential between the two points, although other differential values can be utilized. In this embodiment, the cost differential between points relates to the cost of making a transition from one point to another. The costs used in a calculation such as this can include, for example, costs such as transistor design sizes, resistances, capacitances, power consumption, area or space consumption, parasitics and the like. Thus, plotting or calculating a distance or a minimum distance between a plurality of points can comprise plotting a cost differential between the plurality of points.

Each cluster of design points is defined as a design family, which in one embodiment is a family of sets of variables resulting in similar, joint performance results. A calculated centroid may not exactly correspond to a particular design point that has been simulated, but the closest design point to the centroid may be chosen as representative of the centroid. A designer may select a design family, and a corresponding centroid, on the basis of the simulated subcircuit performance tradeoffs, for further optimization of subcircuit (goals) performance by exploring sets of subcircuit input variables proximate to the centroid, either manually or automatically as discussed above. The closest point can be selected, for example as the closest point spatially, the closest point in terms of cost differential (for example, the closest-cost option), closest in terms of overall performance, or closest in terms of a number of other parameters. Where the closest point is chosen in terms of cost, in a preferred embodiment, the choice can be made by determining the least expensive, or minimal cost differential, between two options. Where multiple cost factors are involved, in one embodiment, the various factors can be assigned weighting values where desired.

Figure 18:
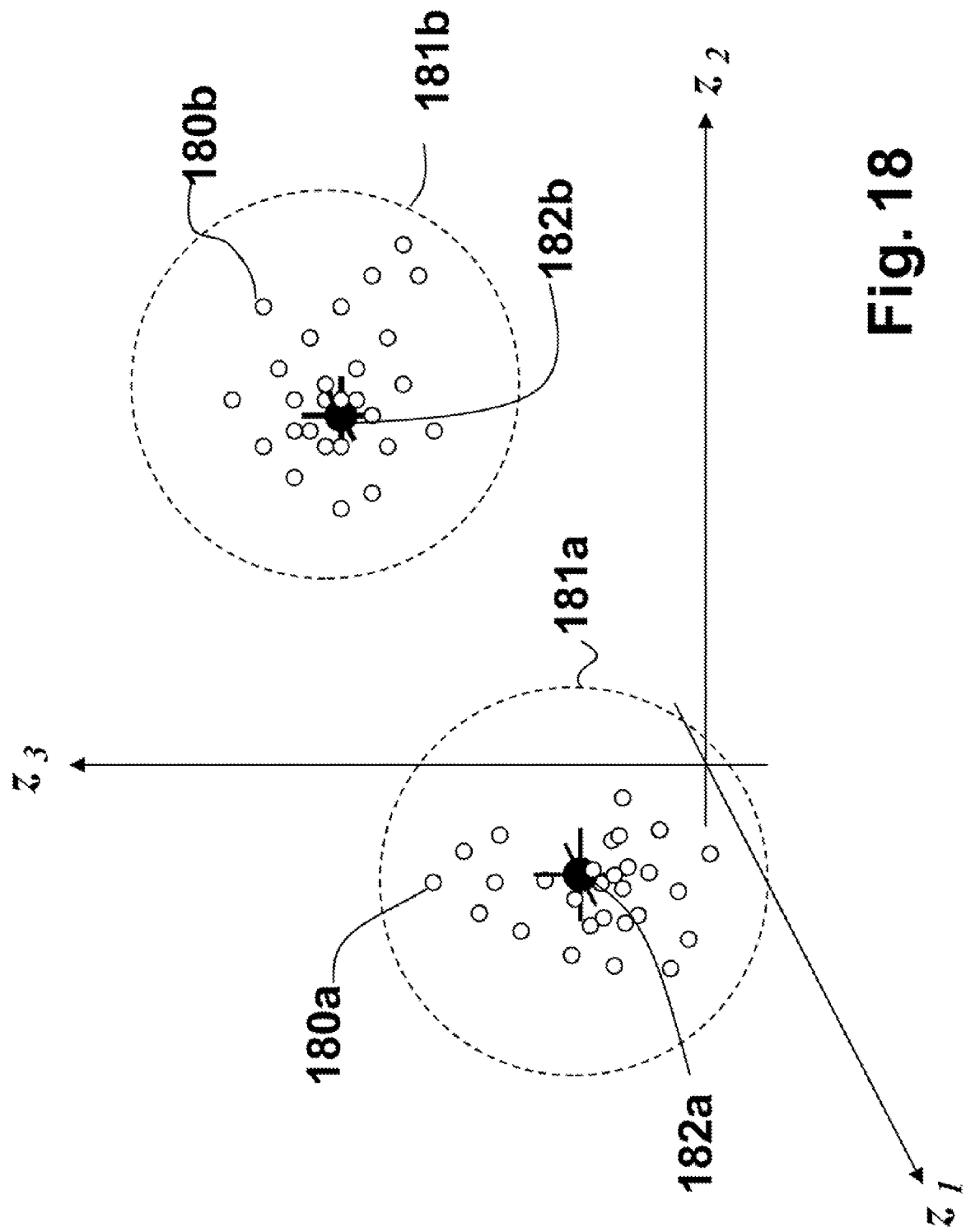
FIG. 18 is an exemplary plot of clusters of a system's top level performance results for various design points in accordance with one embodiment of the invention.
Figure 19:
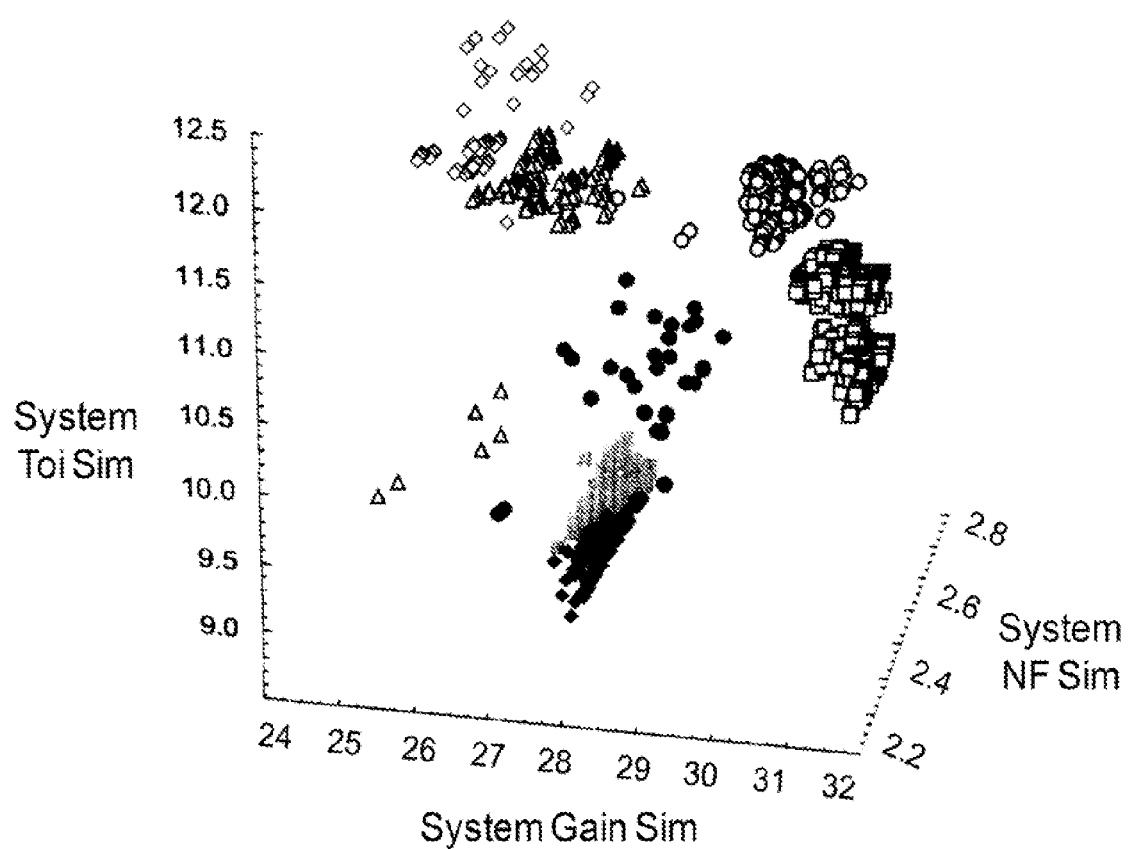
FIG. 19 is another exemplary plot of clusters of a system's top level performance results in accordance with another embodiment of the invention.

FIGS. 18 and 19 illustrate system level design families in accordance with their respective example data set. Referring now to FIG. 18, the families are mapped against three parameters in three directions. Three exemplary performance results for each point are plotted along their respective axes and seen to cluster within regions 180a and 180b. Each of regions 180a and 180b can be thought of as a system level design family, sharing a set of related performance characteristics. Centroids, or "centers of mass" 182a and 182b for design families 181a and 181b, respectively represent central measures for the distributions. Although a centroid may not actually fall on a performance result, the closest performance result to a centroid can be used to approximate the system corresponding to the center of mass of a respective design family.

FIG. 19 illustrates a specific example of plotted clusters of system performance results. The corresponding numerical values are plotted along the three orthogonal axes and are system gain, a noise figure and a third order intercept ("TOI," an extrapolated measure of nonlinear response). In this illustrative example, the system goals are to increase gain and third order intercept while decreasing the noise figure. Each cluster of datapoints points back through the hierarchy to the variables selected for the lower level nodes that led to that dataset. In this illustration, there are seven design families. In this embodiment, the availability of design points relating top level circuit responses to subcircuit responses for functionally defined subcircuits provides additional opportunity for a designer to select optimum design tradeoffs at a top level circuit hierarchical level, in addition to selecting optimum design tradeoffs at a subcircuit level.

In one embodiment, for a single selected design point, the system can be configured to detect a set of points with associated costs in descending order, where cost is computed to take into account changes between two designs resulting from a first design point to a second design point. The cost may include, for example, changes in sizes of basic component layouts (transistors, resistors, capacitors, inductors, etc. . . . ), changes resulting from placement alterations such as area, total net length, replacement of other component layouts, power consumption, and manufacturing yield. Additionally, from a given set of suboptimal design points in the proximity of the tradeoff surface, the system can be configured to determine a subset of points such that the total cost of switching between design points in the subset is minimized. These embodiments can be implemented at different levels of system hierarchy.

Figure 20:
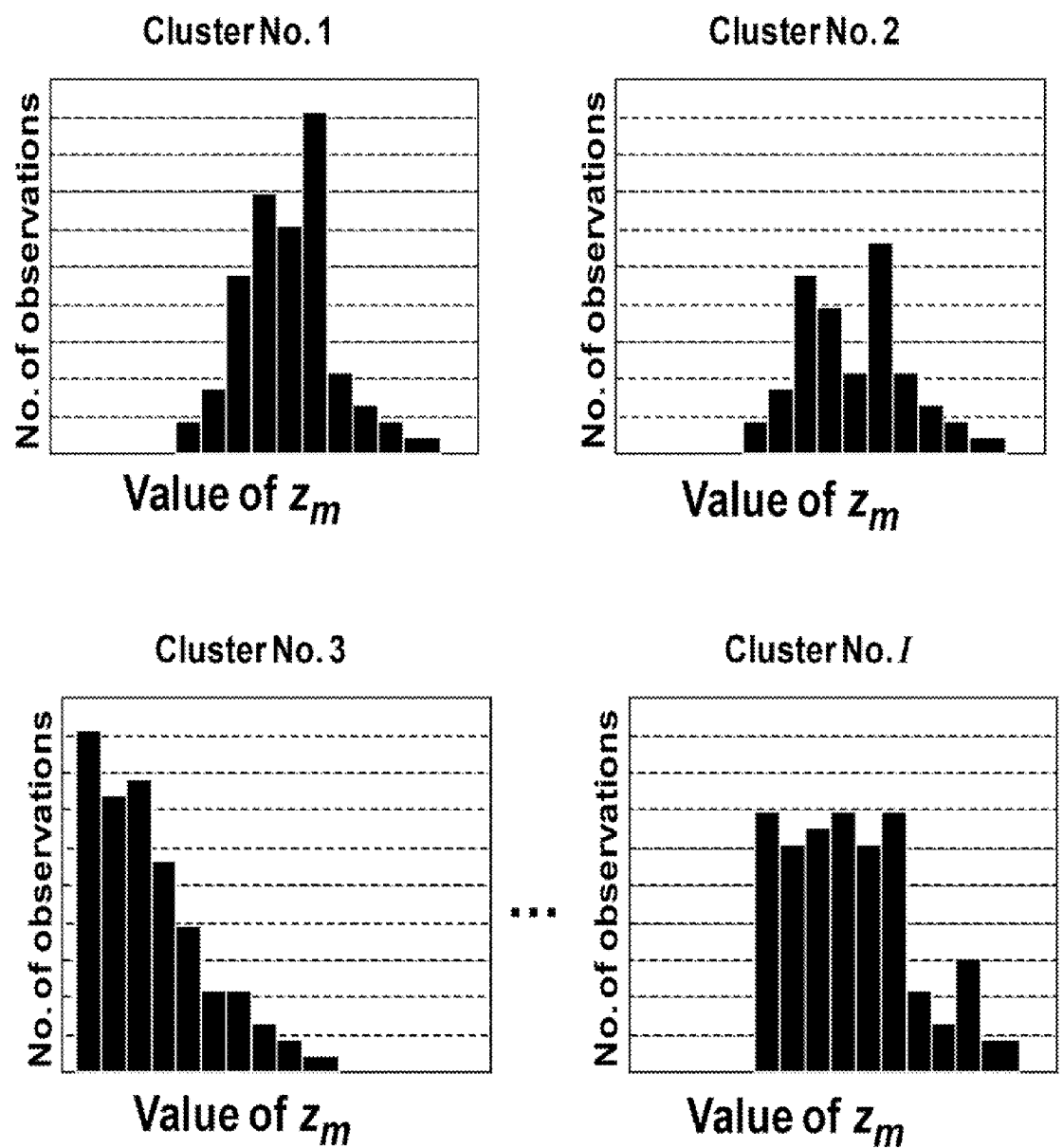
FIG. 20 shows exemplary plots of histograms for various system performance results for a design point set in accordance with another embodiment of the invention.

Because design point clusters corresponding to design families are difficult to display for visualization beyond the three dimensional space, a circuit designer can use multiple representations to explore combinations of simulated subcircuit or circuit responses involving more than three types of defined circuit response. In the embodiment of FIG. 20, histograms display frequencies of simulated design points corresponding to a circuit performance result $z_m$ within particular clusters (i.e. for particular design families). This is useful to visualize the densities of design points corresponding to a particular performance result.

Figure 21:
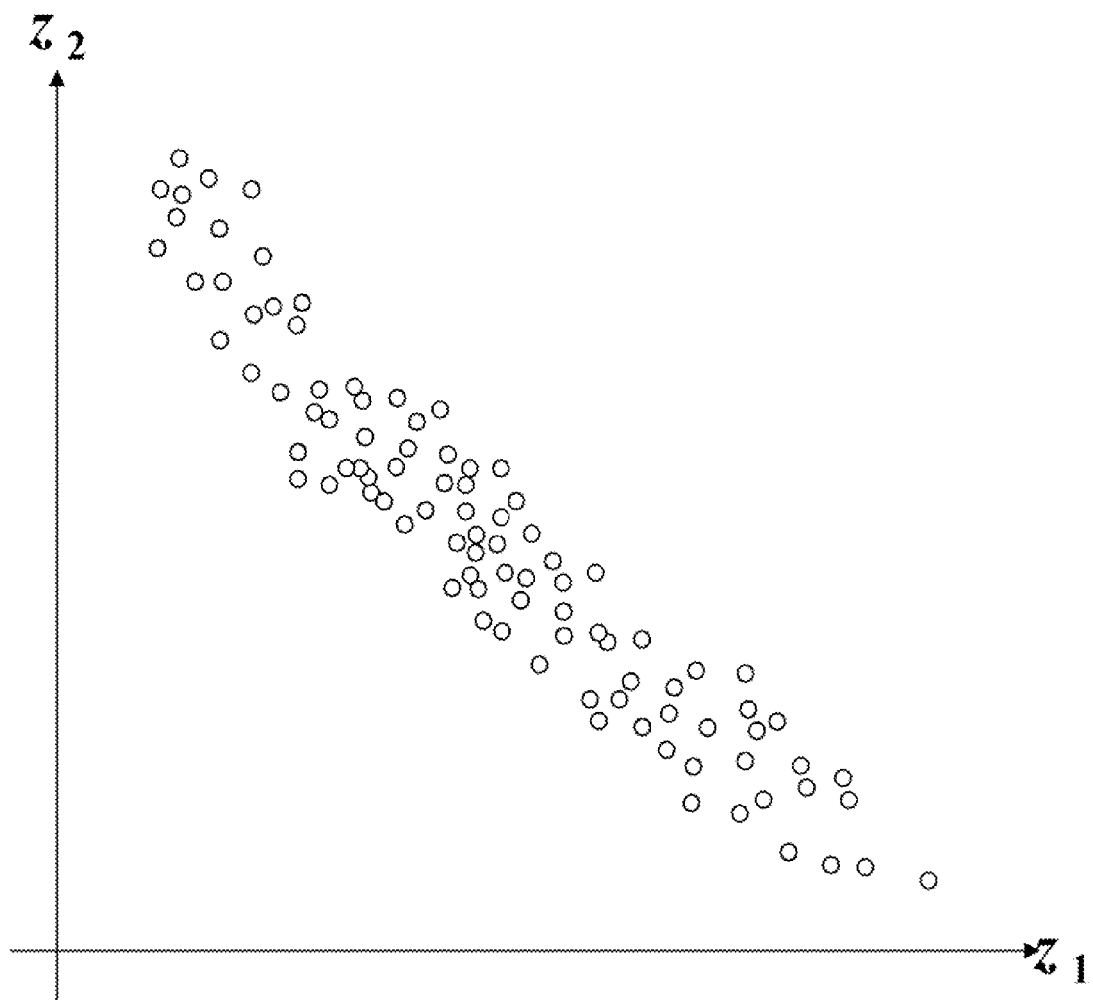
FIG. 21 is an exemplary plot of one system performance result versus another system performance result for a set of design points in accordance with a further embodiment of the invention.
Figure 22:
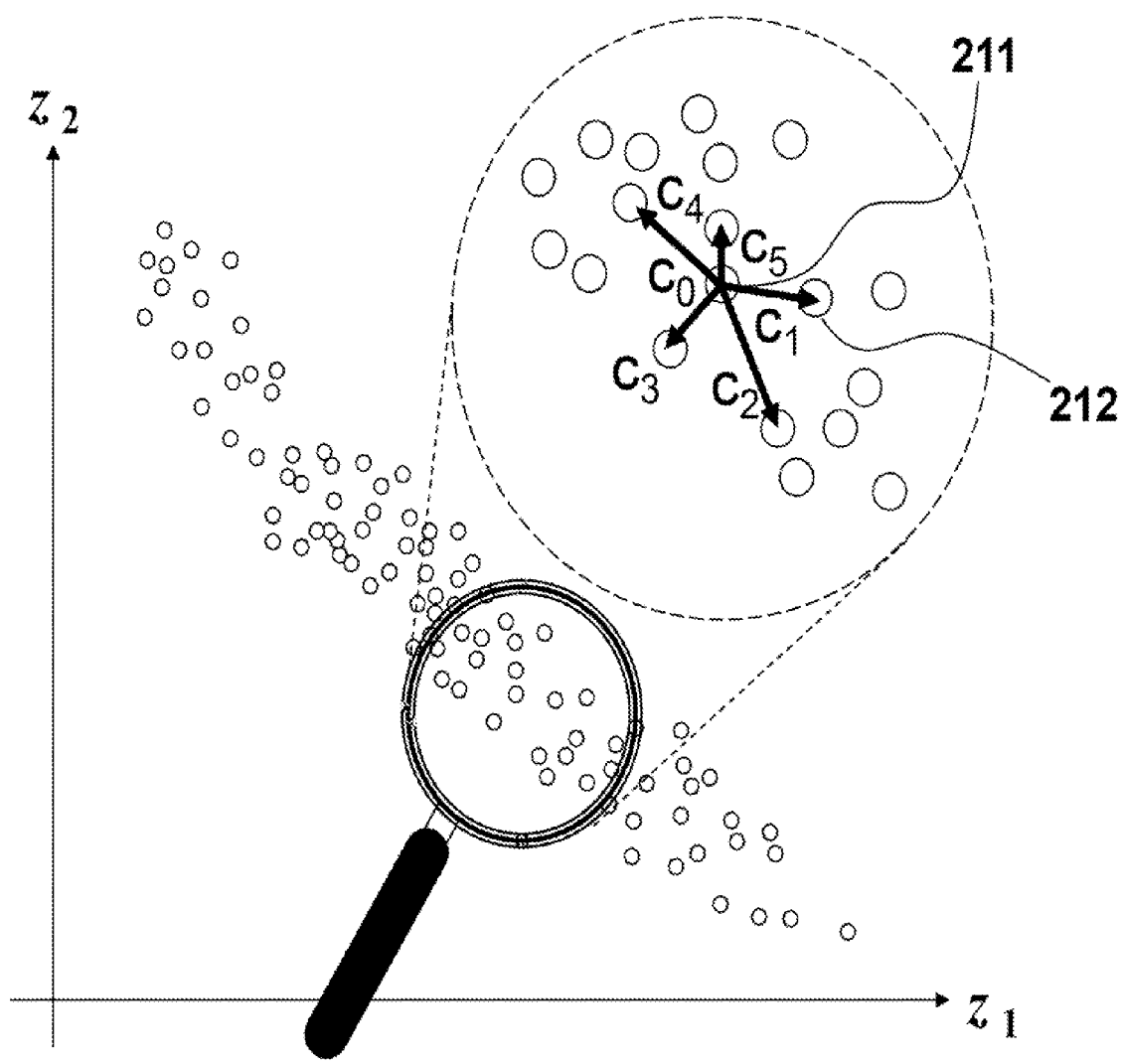
FIG. 22 illustrates a detail of FIG. 21 in which design points are searched to establish a performance tradeoff accordance with one embodiment of the invention.
Figure 23:
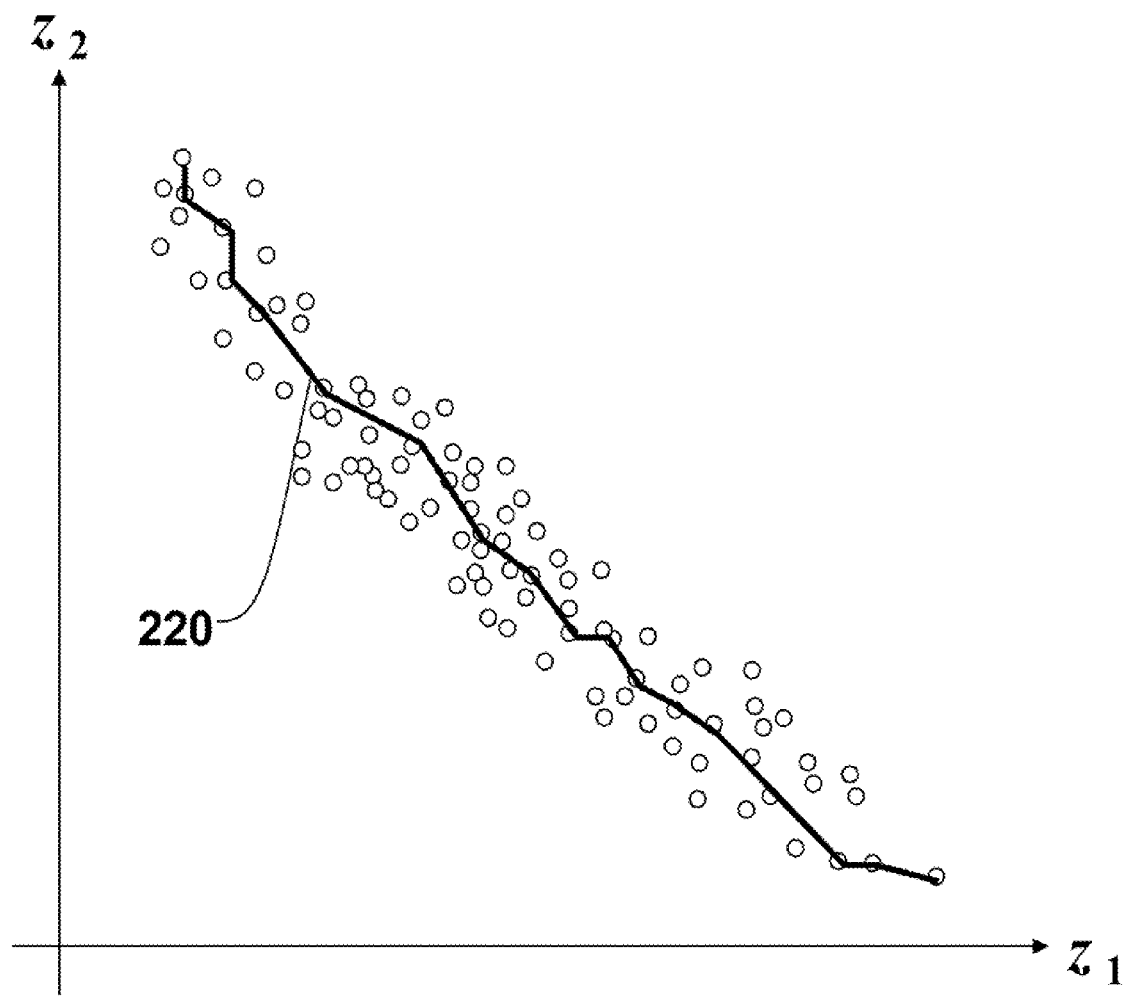
FIG. 23 shows the plot of FIG. 22 with a performance tradeoff line accordance with one embodiment of the invention.

FIG. 21 illustrates an exemplary plot of design points versus two simulated performance goal results, $z_1$ and $z_2$, for a design family. This clearly indicates a performance tradeoff trend between goal result $z_1$ and goal result $z_2$. An embodiment of a method to determine a quantitative design tradeoff relationship can be understood in connection with FIG. 22, wherein the nearest design point 212 to a design point 211 is determined, and then a nearest design point to design point 212 is determined. By this method, a design tradeoff path 220 as shown in FIG. 23 can be calculated on the basis of simulated design points. As discussed above, determination of a nearest design point can be made in terms of cost differential between design points. Where the closest point is chosen in terms of cost, in a preferred embodiment, the choice can be made by determining the least expensive, or minimal cost differential, between two options. Where multiple cost factors are involved, in one embodiment, the various factors can be assigned weighting values where desired. Additionally, in yet another embodiment, the closest point can be calculated as a function of a plurality of parameters, weighted or otherwise. For example, the closest point can be calculated as a function of cost differential and performance differential and the parameters used in the calculation can be weighted according to design goals.

Figure 24A:
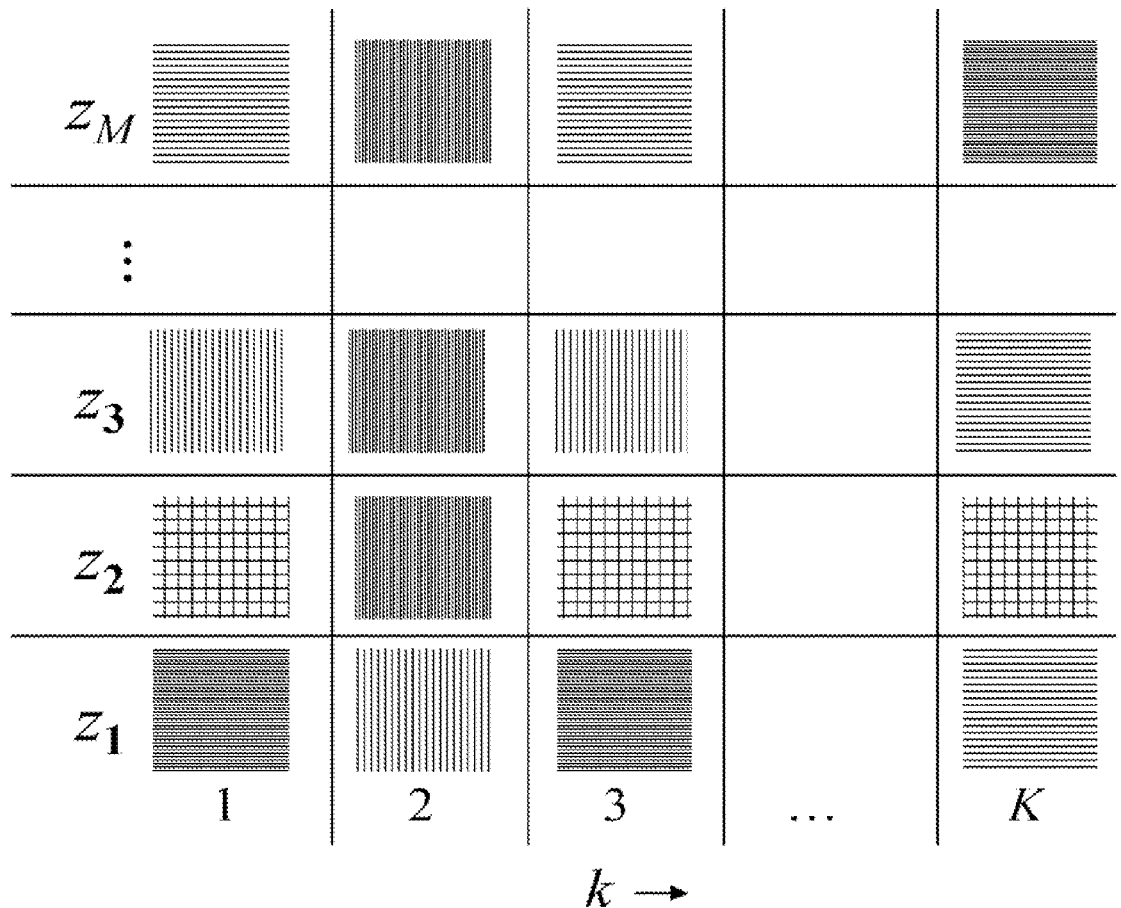
FIG. 24a is an exemplary chart displaying system performance for design points in accordance with a further embodiment of the invention.
Figure 24B:
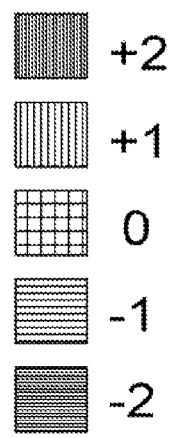

FIG. 24a illustrates another embodiment of the invention in which circuit performance results of types $z_1$ through $z_M$ are arranged in rows of a matrix, and k, the index of the design points, indexes the columns. The matrix entries, corresponding to performance results and design points may visually indicate normalized relationships of performances result to performance target as shown, for example, in FIG. 24b. This display is useful for principal component analysis in which a designer can search for patterns in multiple design tradeoffs, simultaneously.

Embodiments of the present invention may also use additional data mining and visualization techniques as described above, and as described in U.S. Pat. No. 6,954,908 of common assignee with the present invention, which is incorporated by reference herein in its entirety, and others as are well known in the art of data mining and visualization.

Figure 25:
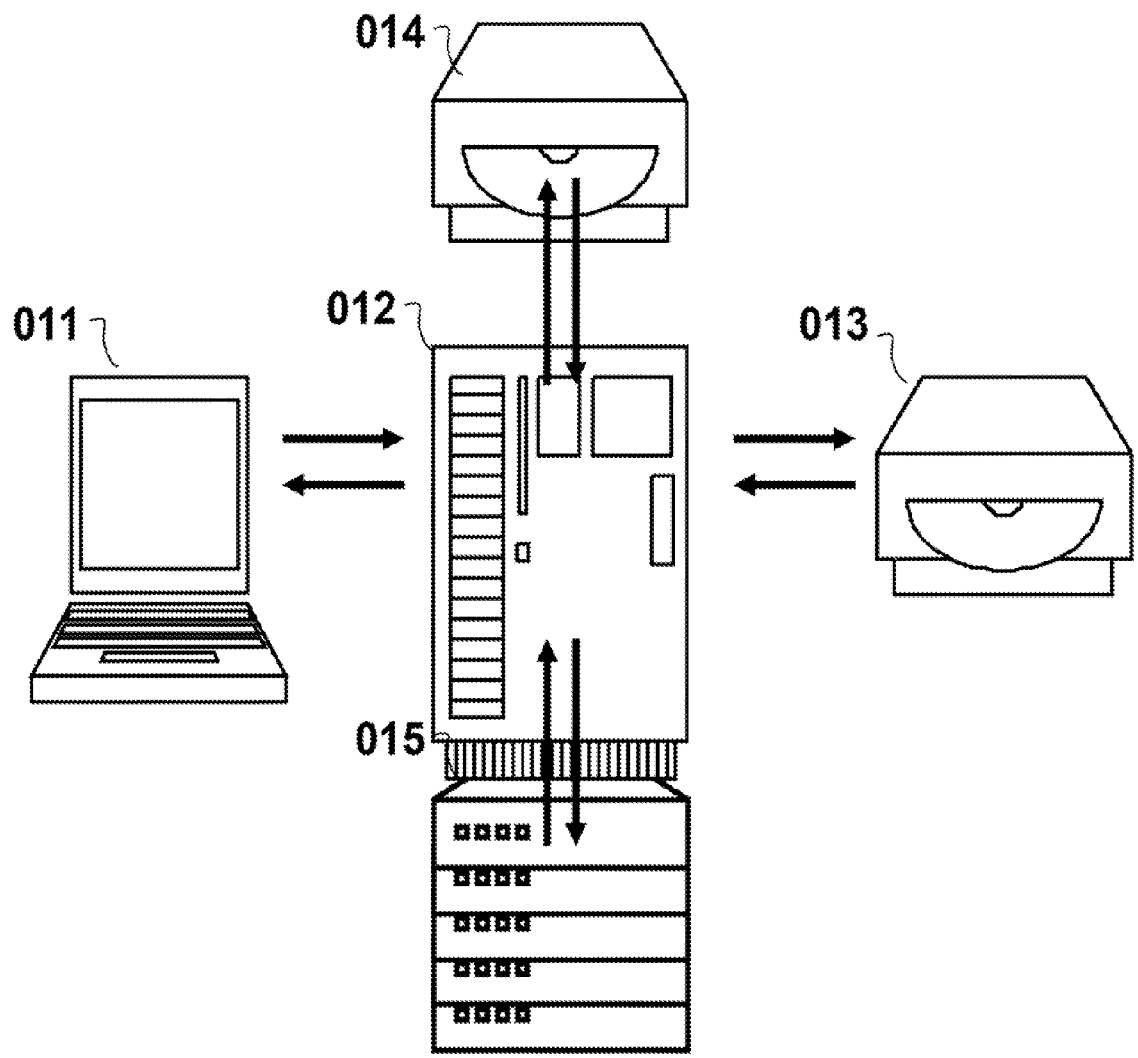
FIG. 25 illustrates an operating environment in accordance with one embodiment of the invention.

FIG. 25 illustrates an exemplary environment for an embodiment of the present invention. The exemplary computer system can include information processing unit 012 operably connected to information storage unit 013, having normally non-removable information storage media; removable media information storage unit 014; computer network connection 015; and visual display and manual data input equipment for a user interface 011. Information processing (also referred to herein as "data processor") unit 012 may be a workstation computer, but it alternately may be any type of digital computer such as, for example, a personal computer, a mini-computer, a mainframe computer, or a multiprocessing computer. Non-removable memory 013 may include different types of memory technology, such as semiconductor memory or hard disk drives, for example. Likewise, removable memory 014 may accommodate different types of information storage media for information storage and/or transfer. Computer programs and data may be stored on both memory units 013 and 014 and operably accessed by information processing unit 012. Computer connection 015 enables information processing unit 012 to send or receive computer programs or data to or from other information processing units, either local or remote. User interface 011 allows a human operator to interact with information processing unit 012.

Although FIG. 25 shows an exemplary operating environment for the invention, alternate operating environments may be readily identified by those of ordinary skill in the art. For example, additional elements may be added and alternate elements substituted without impact on the practice of the invention. Also elements of the operating environment as described above may be subdivided into sub-elements without impact on the practice of the invention.

The algorithm can be implemented in such a manner so as to find a set of valid solutions with the possibility to tailor it to specific customer needs such as, for example: total number of desirable designs; speed of convergence and solution generation; possibility to dynamically alter parameters of the algorithm while the algorithm runs, based on the current state of the algorithm.

In some embodiments utilizing a cluster-based approach, advantages can be gained over prior solutions such as, for example, including the ability to customize the algorithm to specific needs and produce sets of desirable design points for the top-level circuit. This facilitates detailed analysis of the design space for hierarchical designs and possibility for the designer to take into account additional criteria not accounted for during the synthesis process. Another advantage can be reduced run-time and resource requirements in scenarios when formula-based computations are used. It is possible to tune the algorithm convergence and depth of search exploration which gives it advantage over evolutionary computing and other stochastic search methods. It is also possible to avoid local minima with this approach by gradually expanding the search depth. Additionally, the algorithm can be implemented to discover hidden relevant features (also referred to as factors) in each design and help better focus the search algorithm.

In an alternative embodiment of the invention, the system can be configured to find and display corresponding points in the constituent subcircuits from a selected point at the top level of a circuit hierarchy. This can include for example, performance goal space parameters and corresponding input variable space parameters. Additionally, this can be accomplished for a subset of selected points at the top level of the hierarchy. In one embodiment, when the subset is determined by running a grouping algorithm such as, for example, a clustering algorithm, with a designer selecting the groups for clustering (e.g. selection on the basis of group with best gain, the group with lowest noise factor, the group with the best difference between noise factor and third order intermodulation intercept). Alternatively, other partitioning or classification algorithms may be used.

In these embodiments, the displays can include 2-D and 3-D charts, parallel coordinates charts (with or without target value markings), and histograms or scatter-plots showing relationships between two selected performance goals. In yet another embodiment, for performance goal results a list of values is displayed after applying principal components analysis to the performance goal result space. Additionally, a 2-D, a 3-D, a parallel coordinates chart, or a radar chart can be used to display design points as described above.

In yet another alternative embodiment, a visual display of a tree can be provided having nodes representing hierarchical circuit elements (for example, top-level circuit, subcircuits, and basic component layouts) with corresponding design spaces attached to each node such that selecting a node results in displaying one or more information displays of data in that design space. This display can include multiple panes displaying data from different design spaces, possibly from different levels of circuit hierarchy. Additionally, displays of different design spaces can be linked such that selecting sub-set of points in one display results in a selection of mapped points in other displays in cases where selected spaces are linked through subcircuit hierarchy relationships. This can help a circuit designer answer questions such as: "What are the values of input variables when the gain of a basic subcircuit is high/low/medium?"; "How does that influence the system-level gain and/or noise factor?", or "What are the top-level designs that ensure stability (i.e. small variation) in selected transistor sites?".

While various embodiments of the present invention have been described above, it should be understood that they have been presented by way of example only, and not of limitation. Thus the breadth and scope of the present invention should not be limited by any of the above-described exemplary embodiments, but should be defined only in accordance with the following claims and their equivalents.

We claim:

1. A computer implemented method for simulating the performance of a system represented hierarchically as a top level system operably interconnecting a plurality of subsystems, comprising:
    identifying a set of input variable values for each subsystem in the plurality of subsystems;
    simulating a first subsystem in accordance with a corresponding first set of input variable values to generate a first plurality of design points, wherein each design point represents a performance result of the first subsystem based on the first set of input variable values;
    generating a centroid for representing a first subsystem performance result using the first plurality of design points, wherein the centroid is numerically calculated based on a plurality of the first subsystem performance goals;
    simulating the top level system using the centroid to generate a first performance result of the top level system; and
    storing the first performance result of the top level system in an information storage media.

2. The computer implemented method of claim 1, further comprising:
    comparing the first performance result of the top level system with a target system performance result;
    designating that the first set of input variable values corresponds to the target system performance result if the first performance result is close enough in value to the target system performance result; and
    otherwise, replacing the first set of input variable values with a second set of input variable values and repeating the method as recited above if the first performance result is not close enough in value to the target system performance result.

3. The computer implemented method of claim 2 wherein the method is performed by a data processor according to computer-executable instructions stored on a non-transitory computer-readable medium.

4. The computer implemented method of claim 1, wherein simulating comprises at least one of (i) matrix manipulation by an algorithm executed by a data processor, (ii) numerically solving a set of algebraic equations by an algorithm executed by a data processor, (iii) numerically solving a set of ordinary differential equations by an algorithm executed by a data processor, (iv) numerically evaluating a mathematical relation by an algorithm executed by a data processor, and (v) relating a performance result to a respective set of input variable values through a table look-up executed by a data processor.

5. The computer implemented method of claim 1 wherein the system is an electronic circuit, the top level system is a top-most level electronic circuit, and the subsystems are subcircuits.

6. The computer implemented method of claim 5, wherein a performance result comprises at least one of a signal-to-noise ratio, an extrapolated intercept point, and a harmonic distortion level.

7. The computer implemented method of claim 5, wherein an input variable value comprises at least one of a signal-to-noise ratio, an extrapolated intercept point, a harmonic distortion level, and a component model parameter.

8. The computer implemented method of claim 1 wherein the method is performed by a data processor according to computer-executable instructions stored on a non-transitory computer-readable medium.

9. An apparatus for simulating the performance of a system represented hierarchically as a top level system operably interconnecting a plurality of subsystems, comprising:
    means for identifying a set of input variable values for each subsystem in the plurality of subsystems;
    means for simulating a first subsystem in accordance with a corresponding first set of input variable values to generate a first plurality of design points, wherein each design point represents a performance result of the first subsystem based on the first set of input variable values;
    means for generating a centroid for representing a first subsystem performance result using the first plurality of design points;
    means for simulating the top level system using the centroid to generate a first performance result of the top level system; and
    means for storing the first performance result of the top level system.

10. The apparatus of claim 9, further comprising:
    means for comparing the first performance result of the top level system with a target system performance result;
    means for designating that the first set of input variable values corresponds to the target system performance result if the first performance result is close enough in value to the target system performance result; and
    otherwise, means for replacing the first set of input variable values with a second set of input variable values and repeating the method as recited above if the first performance result is not close enough in value to the target system performance result.

11. The apparatus of claim 9, wherein the means for simulating comprises at least one of (i) matrix manipulation by an algorithm executed by a data processor, (ii) numerically solving a set of algebraic equations by an algorithm executed by a data processor, (iii) numerically solving a set of ordinary differential equations by an algorithm executed by a data processor, (iv) numerically evaluating a mathematical relation by an algorithm executed by a data processor, and (v) relating a performance result to a respective set of input variable values through a table look-up executed by a data processor.

12. The apparatus of claim 9 wherein the system is an electronic circuit, the top level system is a top-most level electronic circuit, and the subsystems are subcircuits.

13. A computer program product for simulating the performance of a system represented hierarchically as a top level system operably interconnecting a plurality of subsystems, comprising a non-transitory medium storing computer program code for execution by one or more computer systems, the computer program product comprising:
    code for identifying a set of input variable values for each subsystem in the plurality of subsystems;
    code for simulating a first subsystem in accordance with a corresponding first set of input variable values to generate a first plurality of design points, wherein each design point represents a performance result of the first subsystem based on the first set of input variable values;
    code for generating a centroid for representing a first subsystem performance result using the first plurality of design points, wherein the centroid is numerically calculated based on a plurality of the first subsystem performance goals;
    code for simulating the top level system using the centroid to generate a first performance result of the top level system; and
    code for storing the first performance result of the top level system in an information storage media.

14. The computer program product of claim 13, further comprising:
    code for comparing the first performance result of the top level system with a target system performance result;
    code for designating that the first set of input variable values corresponds to the target system performance result if the first performance result is close enough in value to the target system performance result; and
    otherwise, code for replacing the first set of input variable values with a second set of input variable values and repeating the method as recited above if the first performance result is not close enough in value to the target system performance result.

15. The computer program product of claim 13, wherein code for simulating comprises at least one of (i) matrix manipulation by an algorithm executed by a data processor, (ii) numerically solving a set of algebraic equations by an algorithm executed by a data processor, (iii) numerically solving a set of ordinary differential equations by an algorithm executed by a data processor, (iv) numerically evaluating a mathematical relation by an algorithm executed by a data processor, and (v) relating a performance result to a respective set of input variable values through a table look-up executed by a data processor.

16. The computer program product of claim 13 wherein the system is an electronic circuit, the top level system is a top-most level electronic circuit, and the subsystems are subcircuits.

17. The computer program product of claim 16, wherein a performance result comprises at least one of a signal-to-noise ratio, an extrapolated intercept point, and a harmonic distortion level.

18. The computer program product of claim 16, wherein an input variable value comprises at least one of a signal-to-noise ratio, an extrapolated intercept point, a harmonic distortion level, and a component model parameter.

* * * * *